(12) United States Patent
Pedersen et al.

(10) Patent No.: US 6,323,680 B1
(45) Date of Patent: Nov. 27, 2001

(54) PROGRAMMABLE LOGIC DEVICE CONFIGURED TO ACCOMMODATE MULTIPLICATION

(75) Inventors: Bruce B. Pedersen, San Jose; Sergey Shumarayev, San Leandro; Wei-Jen Huang, Burlingame; Vinson Chan, El Cerrito, all of CA (US); Stephen Brown, Toronto (CA); Tony Ngai, Campbell; James Park, San Jose, both of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/517,350

(22) Filed: Mar. 2, 2000

Related U.S. Application Data
(60) Provisional application No. 60/122,788, filed on Mar. 4, 1999, provisional application No. 60/142,403, filed on Jul. 6, 1999, and provisional application No. 60/142,513, filed on Jul. 6, 1999.

(51) Int. Cl.[7] ........................................................ G06F 7/38
(52) U.S. Cl. ................................. 326/41; 326/40; 326/39; 326/38
(58) Field of Search .................................. 326/38, 39, 40, 326/41

(56) References Cited

U.S. PATENT DOCUMENTS

| | | | |
|---|---|---|---|
| Re. 35,977 | 12/1998 | Cliff et al. ....................... | 364/716.06 |
| 4,623,982 | 11/1986 | Ware .................................... | 364/788 |
| 4,742,520 | 5/1988 | Hoac et al. ............................ | 371/49 |
| 4,815,022 | 3/1989 | Glaeser et al. ....................... | 364/716 |

(List continued on next page.)

OTHER PUBLICATIONS

Actel Corporation, "Implementing Multipliers with Actel FPGAs", Application Note, pp. 4–73 through 4–80, Apr. 1996.

Freeman, R.H., "XC3000 family of user–programmable gate arrays," *Microprocessors and Microsystems*, vol. 13, No. 5, Jun. 1989, pp. 313–320.

Hill, D.D., et al., "Preliminary Description of Tabula Rasa, an Electrically Reconfigurable Hardware Engine," Proceedings of the 1990 IEEE International Conference on Computer Designs: VLSI in Computers & Processors, Sep. 17–19, 1990, pp. 391–395.

Lucent Technologies Inc., "Multipliers in ORCA OR2CxxA/ OR2TxxA FPGAs", Microelectronics Application Note, pp. 1–8, May 1996.

Lucent Technologies Inc., "Implementing and Optimizing Multipliers in ORCA FPGAs", Microelectronics Group Application Note, pp. 1–12, Feb. 1997.

Patterson, D.A., et al., *Computer Architecture, A Quantitative Approach*, second ed., pp. A–38 to A–46 (Morgan Kaufmann Publishers, San Francisco, 1990).

*Primary Examiner*—Michael Tokar
*Assistant Examiner*—Vibol Tan
(74) *Attorney, Agent, or Firm*—Fish & Neave; Jeffrey H. Ingerman

(57) ABSTRACT

A programmable logic device is configured to accommodate multiplication by the provision in each logic region of specialized components to form and sum partial products. The specialized components are separate from the ordinary logic of the logic region, and their presence imposes little penalty on the performance of ordinary logic functions, while enhancing the speed at which multiplication is performed by minimizing the number of logic regions used for a particular multiplication operation, and also minimizing the use of the interconnection resources of the device to convey signals among those regions.

33 Claims, 13 Drawing Sheets

U.S. PATENT DOCUMENTS

| | | | |
|---|---|---|---|
| 4,963,770 | 10/1990 | Keida | 307/465 |
| 5,053,647 | 10/1991 | Shizukuishi et al. | 307/465 |
| 5,059,828 | 10/1991 | Tanagawa | 307/469 |
| 5,274,581 | 12/1993 | Cliff et al. | 364/784 |
| 5,349,250 | 9/1994 | New | 307/465 |
| 5,362,999 | 11/1994 | Chiang | 326/44 |
| 5,386,156 | 1/1995 | Britton et al. | 326/37 |
| 5,396,127 | 3/1995 | Chan et al. | 326/44 |
| 5,448,186 | 9/1995 | Kawata | 326/41 |
| 5,537,057 | 7/1996 | Leong et al. | 326/41 |
| 5,570,039 | 10/1996 | Oswald et al. | 326/39 |
| 5,631,576 | 5/1997 | Lee et al. | 326/39 |
| 5,648,732 * | 7/1997 | Duncan | 326/40 |
| 5,672,985 | 9/1997 | Lee | 326/41 |
| 5,859,542 | 1/1999 | Pedersen | 326/39 |
| 5,909,126 | 6/1999 | Cliff et al. | 326/41 |
| 5,926,036 | 7/1999 | Cliff et al. | 326/40 |
| 5,999,015 | 12/1999 | Cliff et al. | 326/39 |
| 6,020,756 * | 2/2000 | New | 326/39 |
| 6,107,824 * | 8/2000 | Reddy et al. | 326/41 |
| 6,140,839 * | 10/2000 | Kaviani et al. | 326/41 |
| 6,154,049 * | 11/2000 | New | 326/39 |

* cited by examiner

FIG. 7

PROGRAMMABLE LOGIC DEVICE CONFIGURED TO ACCOMMODATE MULTIPLICATION

CROSS REFERENCE TO RELATED APPLICATIONS

This claims the benefit of copending, commonly-assigned U.S. Provisional Patent Applications Nos. 60/122,788, 60/142,403 and 60/142,513, filed Mar. 4, 1999, Jul. 6, 1999 and Jul. 6, 1999, respectively, which are hereby incorporated by reference herein in their entireties.

BACKGROUND OF THE INVENTION

This invention relates to programmable logic devices that are configured to accommodate multiplication. More particularly, this invention relates to programmable logic devices including logic elements having features that facilitate the performance of multiplication operations with minimal adverse impact on the performance of other operations of the logic elements.

Programmable logic devices ("PLDs") typically include (1) many regions of programmable logic, and (2) programmable interconnection resources for selectively conveying signals to, from, and/or between those logic regions. Each logic region is programmable to perform any of several different, relatively simple logic functions. The interconnection resources are programmable to allow the logic regions to work together to perform much more complex logic functions than can be performed by any individual logic region. Examples of known PLDs are shown in U.S. Pat. Nos. 3,473,160, Re. 34,363, 5,689,195 and 5,909,126, and U.S. patent application Ser. No. 09/266,235, all of which are hereby incorporated by reference herein in their entireties.

One of the functions that can be implemented in a PLD is the multiplication of one number by another. Typically, each the multiplicands in such an operation would have multiple bits. As is well known, the first step of such a multiplication can be performed by multiplying each bit of the first multiplicand by the least significant bit of the second multiplicand to form a first partial product. Next, the first multiplicand is shifted left one digit (in a binary number, that has the effect of multiplication by two) and multiplying each bit by the second least significant bit of the second multiplicand to form a second partial product. The same procedure is performed for the remaining bits of the second multiplicand (with appropriate additional shifting of the first multiplicand) to form additional partial products. All of the partial products are added together to form a sum, representing the desired product.

A multiplication operation such as that just described can be implemented in known PLDs, using the logic regions to perform the individual multiplications and summations, and using the interconnect network to route the intermediate results of those individual operations between the appropriate logic regions until the final result has been achieved. However, the need to route each intermediate result onto the general interconnect network results in a significant speed penalty in the determination of the final product. Moreover, the logic regions typically are optimized to perform the more common logic operations, rather than arithmetic operations. Therefore, the multiplication operation is slowed down within the logic regions as well. In addition, in some known devices in which provision for multiplication has been made, AND gates have been provided on the front end of each logic region to facilitate the formation of partial products and sums thereof, but all signals have to pass through those AND gates for all operations, slowing down non-multiplication operations.

It would be desirable to be able to provide a programmable logic device optimized to perform multiplication operations.

It would also be desirable to provide such a programmable logic device with little or no speed penalty in the performance of logic operations.

SUMMARY OF THE INVENTION

It is an object of this invention to provide a programmable logic device optimized to perform multiplication operations.

It is also an object of this invention to provide such a programmable logic device with little or no speed penalty in the performance of logic operations.

In accordance with the present invention, there is provided a programmable logic device having a plurality of regions of programmable logic. Each of the regions has a plurality of input terminals and at least one output terminal. Each of the regions is programmable to selectively perform any of a plurality of logic functions on input signals applied to the input terminals to produce an output signal applied to the output terminal. An interconnection network is programmable to selectively connect the output terminal of substantially any of the regions to at least one of the input terminals of substantially any of the regions. Each region in at least a subset of the plurality of regions of programmable logic has additional logic dedicated to the performance of functions forming at least part of a multiplication operation. Dedicated conductors for the output of at least a portion of the multiplication operation are also provided.

In a preferred embodiment, the invention is implemented in a programmable logic device of the type described in copending, commonly-assigned U.S. patent application Ser. No. 09/516,921, filed concurrently herewith, which is hereby incorporated by reference herein in its entirety, as well as in above-incorporated U.S. Pat. No. 5,689,195 and Applications Nos. 60/122,788, and 60/142,513. In such a programmable logic device, logic is arranged in regions, which are then arranged in groups or blocks spanning, preferably, ten rows of logic regions. The interconnection network includes local conductors, global conductors, and conductors of intermediate lengths.

In the preferred embodiment, each logic region preferably has four inputs and the additional logic in each logic region is a multiplexer into which one bit or digit of a multiplicand, and one bit or digit of that multiplicand shifted left one digit (i.e., multiplied by two), are input as data, and two bits of the other multiplicand are input as control signals. These inputs may be stolen from the same four inputs that otherwise would be used as inputs to the logic region. Alternatively, the inputs for the bits of the first multiplicand and the first multiplicand multiplied by two could be stolen from the ordinary inputs to the logic region as just described, while the bits of the other multiplicand could be input on conductors normally used for signals to multiple logic regions in the group (e.g., clock or clear signals, etc.).

The arrangement just described produces, in a single logic region, one bit or digit of the sum of two partial products. In traditional multiplier arrangements, that result would require at least three logic regions—at least one to form a first partial product, at least one to form a second partial product, and at least one to add the two partial products together. Performing all of these functions in one logic region reduces the number of logic regions required, reduces the use of the interconnection network, and also speeds up this portion of the computation.

Assuming two 16-bit-wide multiplicands, a column of at least sixteen logic regions is required to form two bits of the partial products if two bits of one multiplicand serve as the multiplexer control inputs. Thus, eight such columns of logic regions will form all bits of the partial products. Each column of logic regions will also produce a sum of the two partial products it produces. However, all of those sums of partial products must be further added together to complete the multiplication operation. This can be done in a conventional adder tree, using additional logic regions. But implementation of a conventional adder tree would involve heavy use of the interconnection network. Therefore, in accordance with the invention, each logic region preferably has a dedicated output for its bit of the sum of partial products, for conducting that portion of the sum to a neighboring or nearby logic region. When the programmable logic device is programmed to perform multiplication, the logic preferably is laid out on the device (e.g., by the programming software) so that the logic regions used to form the sums of partial products alternate with other logic regions used in the adder tree, and the dedicated sum output of each logic region is used to conduct the sum of partial products from that logic region to a neighboring logic region that is part of the adder tree (in one embodiment, the dedicated sum output connects directly to the neighboring region). Again, this speeds up the operation and also takes traffic off the interconnection network.

In an alternative preferred embodiment, a dedicated adder is provided on the programmable logic device between each column of logic regions, so that all of the summing of sums of products can be done in the adders, without the need to consume logic regions for that purpose. In a third preferred embodiment, a dedicated conductor conducts the output of each logic region to a logic region several columns away, to facilitate construction of an adder tree.

It is necessary to provide a carry output from each logic region to the next logic region in the chain. For a 16-bit-by-16-bit multiplication, up to 32 logic regions in a single column may be necessary at the center of the adder tree. However, in the programmable logic device described in said above-incorporated Patent No. 5,689,195, the logic regions are grouped in groups or blocks spanning ten rows, without the ability to conduct a carry output to additional logic regions in other groups. Therefore, according to the present invention, a carry output preferably is provided between every logic region and the logic region in the row below, whether or not that row is part of the same group of logic regions.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which:

FIG. 7 is an algebraic representation of the multiplication of two sixteen-bit numbers, including the formation of partial products;

DETAILED DESCRIPTION OF THE INVENTION

Figure 1:
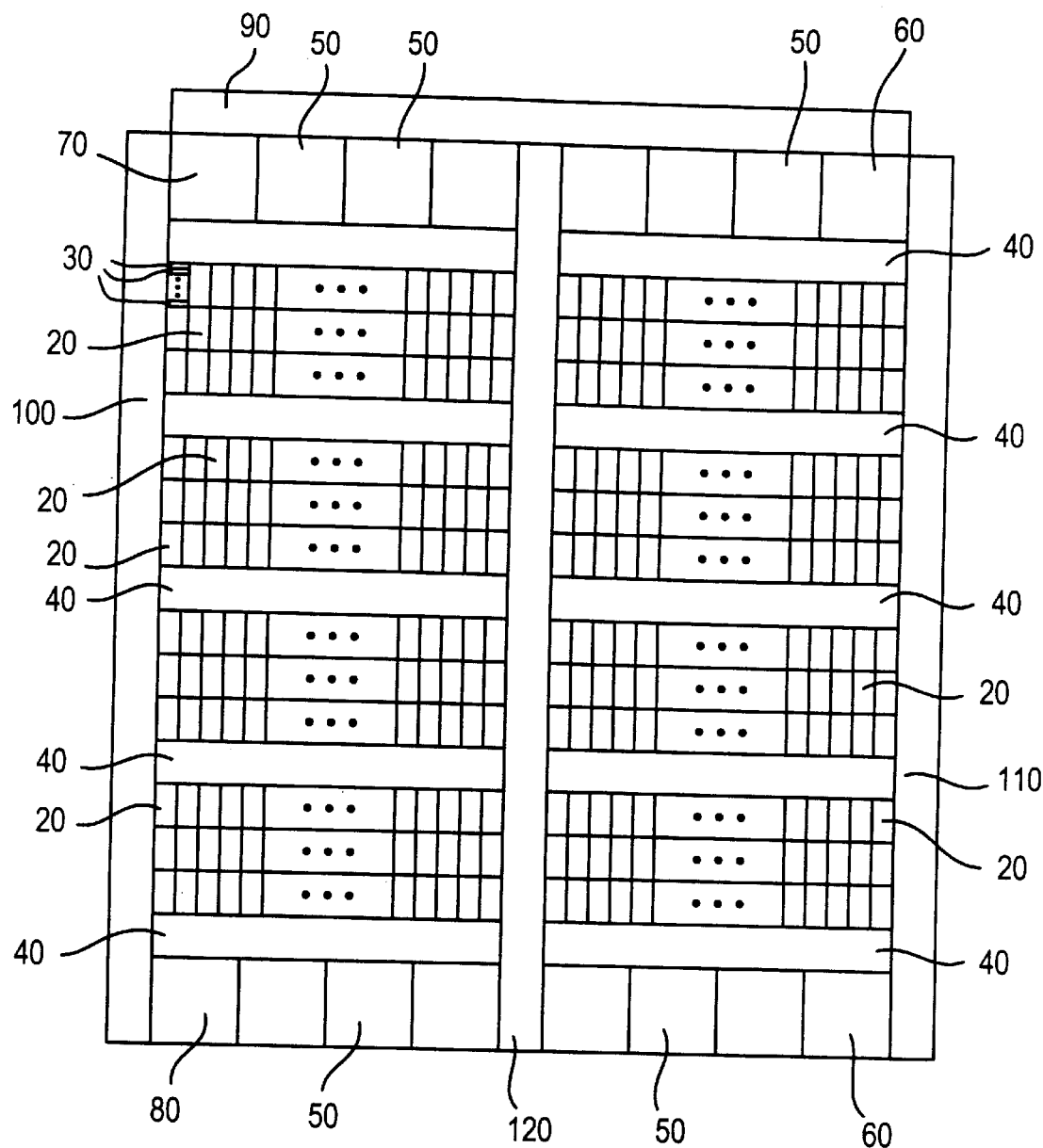
FIG. 1 is a simplified block diagram of an illustrative programmable logic device in which the present invention can be used.

Although the present invention can be used in different types of programmable logic devices, an illustrative programmable logic device 10 in which the present invention can be used is shown in FIG. 1, and is also described in above-incorporated Applications Nos. 60/122,788, 60/142,513, and 09/516,921. Device 10 preferably includes twelve rows of blocks 20 of programmable logic. Each row preferably includes forty blocks 20. Thus blocks 20 preferably are disposed on device 10 in a two-dimensional array of twelve rows intersecting forty columns of blocks 20.

Each block 20 preferably includes ten regions 30 of programmable logic. To avoid over-complicating FIG. 1, the individual regions 30 are delineated only in the extreme upper-left-hand block 20. As will explained more fully below, each region 30 is programmable by a user of device 10 to perform preferably any of several relatively small logic functions. Extremely complex logic functions preferably can be performed by concatenating regions 30 via a programmable network of interconnection conductors and other associated interconnection resources on device 10.

Preferably, interspersed among the rows of blocks 20 are five rows of input/output ("I/O") pins and associated I/O circuitry 40. One of I/O rows 40 preferably is at the top of the rows of blocks 20. Another I/O row 40 preferably is at the bottom of the rows of blocks 20. A third I/O row 40 preferably is between the third and fourth rows of blocks 20. A fourth I/O row 40 preferably is between the sixth and seventh rows of blocks 20. A fifth I/O row 40 preferably is between the ninth and tenth rows of blocks 20.

Above the top I/O row 40 preferably is a row of memory blocks 50 that can be used by the user of device 10 as random access memory ("RAM"), read-only memory ("ROM"), product-term ("p-term") logic, content addressable memory, etc. Another similar row of memory blocks 50 preferably is provided below bottom I/O row 40.

At the right-hand end of each row of memory blocks 50 preferably is a block 60 of phase-locked loop circuitry which can be used to generate clock signals that are shifted in phase relative to clock signals that are applied to device 10 from external circuitry that is not shown in FIG. 1.

At the left-hand end of the top row of blocks 50 preferably is a block 70 of control logic and pins. This circuitry preferably is used for controlling device 10 during programming and test of the device prior to its use in normal logic operations.

At the left-hand end of the bottom row of blocks 50 preferably is a block 80 of JTAG logic and pins. The circuitry of block 80 can be used by the user of the device for in-system programming and test of device 10 prior to use of the device in normal logic operations.

The top-most row of circuitry shown in FIG. 1 preferably is address and clear register circuitry 90 that is used during programming of device 10 prior to normal logic operations. The left-most column of circuitry shown in FIG. 1 preferably is data register circuitry 100 that is used during programming prior to normal logic operations. The right-most column of circuitry shown in FIG. 1 preferably is test register circuitry 110 that is also used during programming prior to normal logic operations. In typical use, programming data preferably are loaded into circuitry 100 from external circuitry that is not shown. These data preferably flow from left to right across device 10 for storage in a vertical slice of locations preferably determined by address information in circuitry 90. Data for use in confirming that device 10 is properly programmable and/or properly operable can be read out of device 10 via registers 110.

Block 120 of so-called secondary signal conductor resources preferably is located at or near the left-to-right center of device 10. Block 120 preferably is part of a network of signal propagation resources that is used for distributing widely needed signals throughout device 10. Examples of such signals include clock signals, clear signals, set signals, reset signals, and the like.

Figure 2:
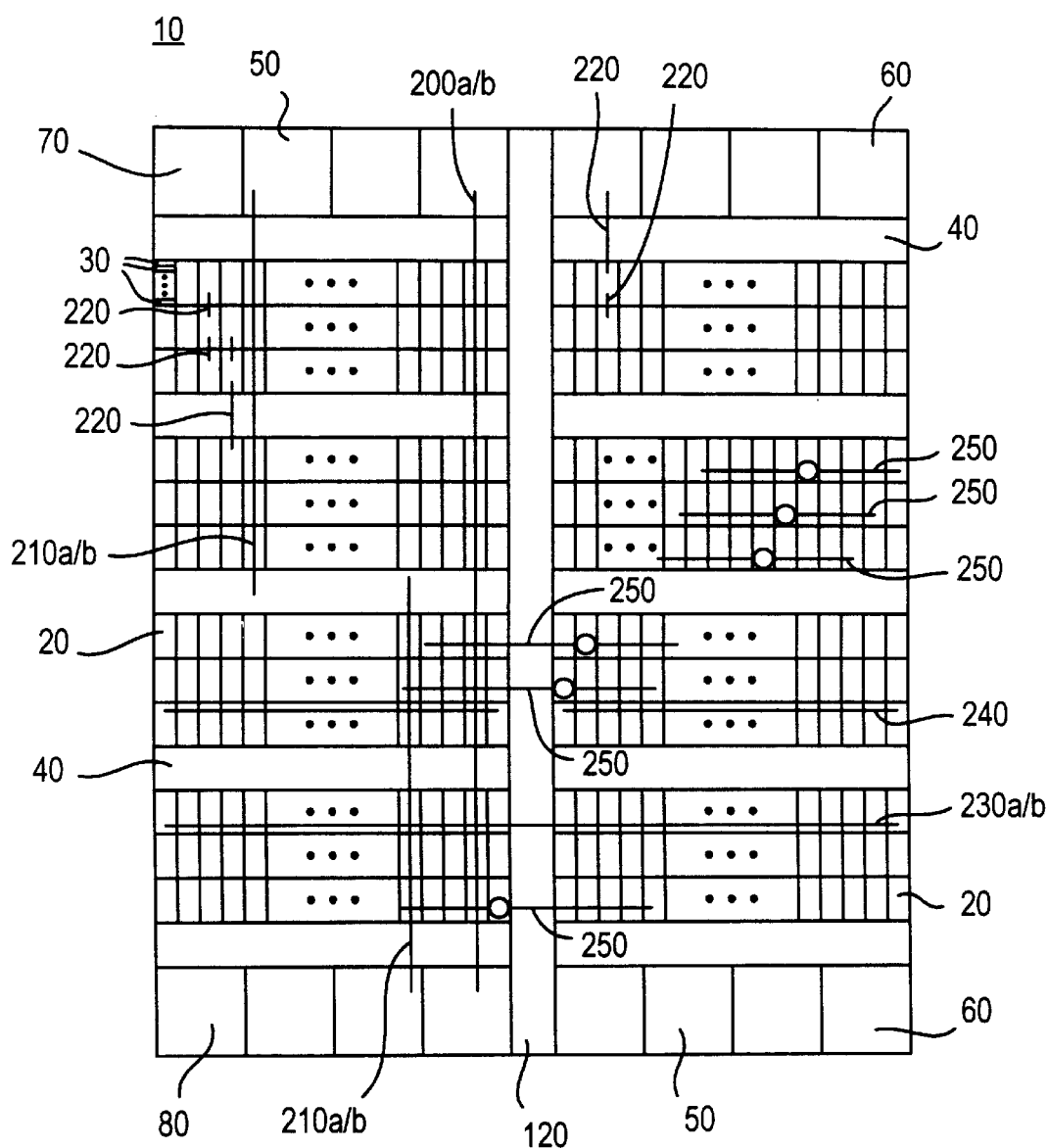
FIG. 2 shows a portion of the programmable logic device of FIG. 1 with the addition of representative, illustrative interconnection resources.

FIG. 2 is similar to a portion of FIG. 1, but shows some of the interconnection resources that are provided on device 10. Preferably, associated with each column of logic blocks 20, and extending into memory rows 50, is a plurality of so-called global vertical conductors 200. Only some representative conductors 200 are shown in FIG. 1 to avoid overcrowding the drawing. Each group of conductors 200 preferably includes a relatively large subset of such conductors designated 200a that have normal signal propagation speed characteristics. Each group of conductors 200 preferably also includes a relatively small subset of such conductors designated 200b that have significantly faster signal propagation speed characteristics.

Preferably, associated with the upper half of each column of logic blocks 20, and extending into the upper row of memory blocks 50, is a plurality of so-called half vertical interconnection conductors 210. Similar half vertical interconnection conductors 210 preferably are associated with the lower half of each column of logic blocks 20 and the lower row of memory blocks 50. Again, only some representative conductors 210 are shown to avoid overcrowding the drawing. As in the case of conductors 200, each set of conductors 210 preferably includes a relatively large subset 210a of normal-speed conductors and a relatively small subset 210b of higher-speed conductors. The ratio of conductors 210a to conductors 210b may be similar to the ratio of conductors 200a to 200b.

Preferably, also associated with each column of logic blocks 20 are pluralities of so-called interleaved vertical ("IV") conductors 220. Once again, only some representative conductors 220 are shown to avoid overcrowding the drawing. Each group of conductors 220 preferably extends between vertically adjacent logic blocks 20 and memory blocks 50, preferably extending across any intervening I/O block 40. Whereas conductors 200 and 210 are useful for conveying signals between any of the rows of elements 20, 40, and 50 that they cross, conductors 220 are useful for speeding up connections between vertically adjacent elements 20 and 50, and for additionally helping to reduce the numbers of conductors 200 and 210 that must be provided to satisfy the need for vertical interconnectivity on device 10. Additional details regarding IV conductors can be found in copending, commonly-assigned U.S. patent application Ser. No. 09/517,146, filed concurrently herewith, which is hereby incorporated by reference herein in its entirety.

Preferably, associated with each row of logic blocks 20 is a plurality of so-called global horizontal interconnection conductors 230. Only some representative conductors 230 are shown to avoid overcrowding the drawing. Each set of conductors 230 preferably includes a relatively large subset 230a of normal-speed conductors and a relatively small subset 230b of significantly faster conductors. The ratio of normal to fast conductors 230 may be similar to previously described ratios of normal to fast conductors.

Preferably, associated with and extending along the left half of each row of logic blocks 20 is a plurality of so-called half or direct horizontal interconnection conductors 240. Similar half horizontal conductors 240 preferably extend along the right half of each row of logic blocks 20. Once again, only a few representative conductors 240 are shown to avoid overcrowding the drawing.

Also preferably associated with each row of logic blocks 20 are several pluralities of so-called HNFL (horizontal network of fast lines) interconnection conductors 250. Except at the ends of the rows, where some HNFL conductors are necessarily shorter, each group of HNFL conductors 250 preferably spans ten logic blocks 20. In addition, the conductors in each group of HNFL conductors 250 preferably are drivable only by the logic block 20, or other signal sources, at the center of that group (exceptions again being made at the ends of the rows). Whereas conductors 230 and 240 are useful for conveying signals between any of the logic blocks 20 that they span, conductors 250 preferably are usable only to convey signals from the logic block 20, or other signal sources, that are central to the group that includes that conductor to the fixed number of logic blocks to the left and/or right of that central logic block. Each logic block 20 in each row preferably is the central/driving logic block for an associated plurality of conductors 250. Additional details regarding HNFL conductors can be found in above-incorporated copending, commonly-assigned U.S. patent application Ser. No. 09/517,146.

Figure 3:
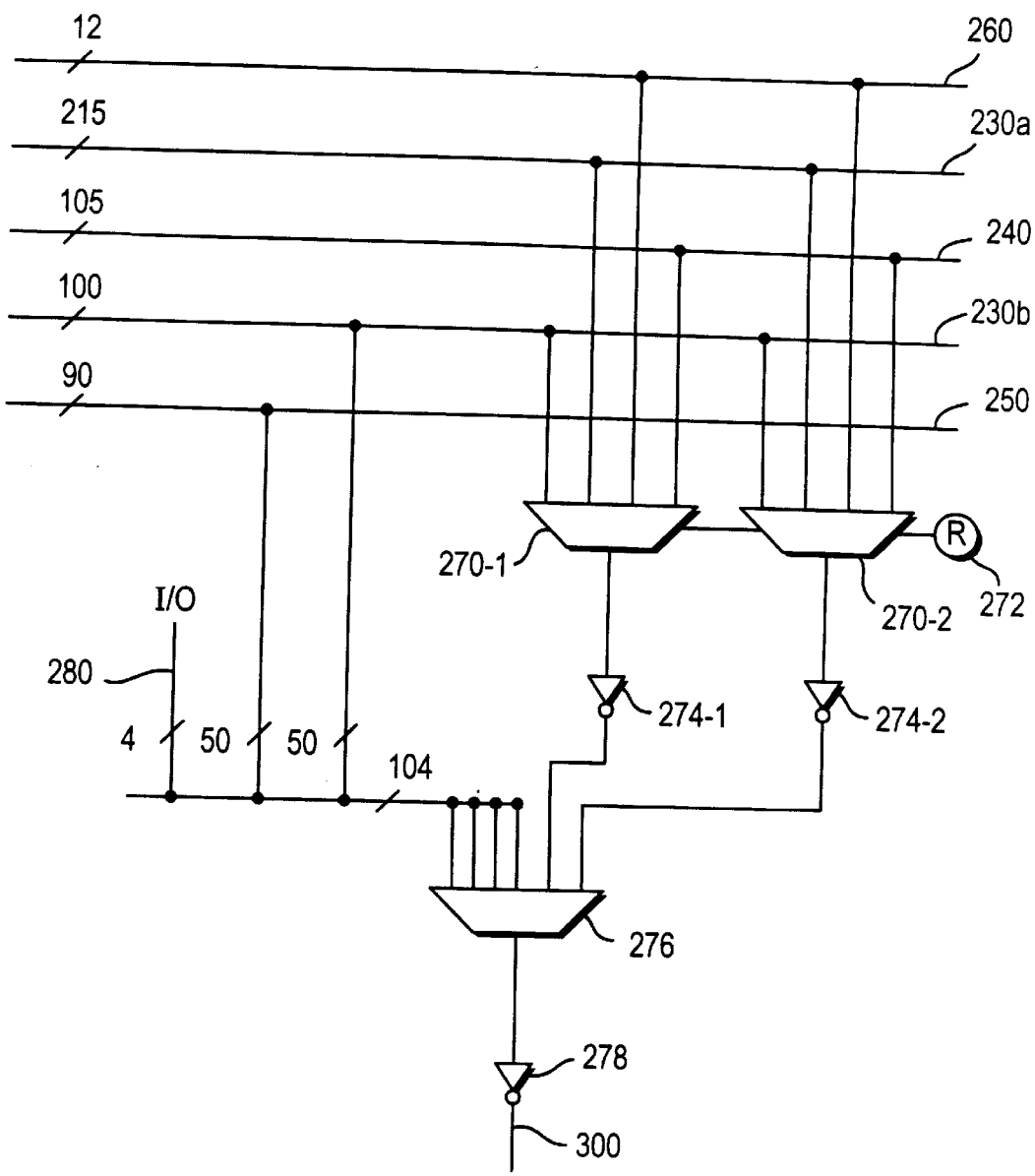
FIG. 3 is a simplified schematic block diagram of additional representative, illustrative interconnection resources for use on the device of FIGS. 1 and 2 in accordance with the invention.

FIG. 3 shows representative interconnectivity and circuitry for conveying signals from horizontal conductors associated with a row of logic blocks 20 to logic blocks in that row. FIG. 3 shows that there are 215 normal-speed global horizontal conductors 230a passing near a logic block, 100 fast global horizontal conductors 230b passing near that logic block, 105 half horizontal conductors 240 passing near the logic block, 90 HNFL conductors 250 passing near the logic block, and twelve secondary conductors 260 passing near the logic block. As noted earlier, the last-mentioned secondary conductors 260 may convey signals such as clocks, clears, and the like. Some of these signals 260 may come from central secondary signal block 120 (FIG. 1); others may be generated more locally (e.g., in the adjacent row of logic blocks 20) and may be usable only in the locale of the source (i.e., the source row).

FIG. 3 further shows a representative logic-block-feeding conductor 300. Depicted conductor 300 is one of a group of 26 similar conductors that are disposed between two horizontally adjacent logic blocks 20 in the logic block row served by the depicted conductors 230a, 230b, etc. Similar groups of 26 conductors 300 are interleaved between all horizontally adjacent logic blocks 20 in all logic block rows.

For each conductor 300, selected ones of conductors 230a, 230b, 240, and 260 are connected to inputs of two programmable logic connectors ("PLCs"; e.g., multiplexers) 270-1 and 270-2. PLCs 270 are each typically controlled by programmable function control elements ("FCEs") 272 to apply to their output the signal on any one of their inputs. (Although shown with four inputs, it will be understood that each PLC 270 may have fewer or more than four inputs (e.g., two, three, six, seven, or eight inputs).) The output signal of each PLC 270 is applied to a respective inverting buffer (amplifier) 274, and thence to a respective input of PLC 276. The other inputs to PLC 276 come from selected ones of adjacent conductors 230b and 250 and (via leads 280) from an associated I/O block 40 (if any). PLC 276 is controlled by FCEs (not shown, but similar to FCEs 272) to apply to its output the signal on any one of its inputs. The output signal of PLC 276 is applied to conductor 300 via inverting buffer 278. The above-mentioned association of I/O blocks 40 and logic blocks 20 is as follows: top rows 20 and 40, second row 40 and fourth row 20, third row 40 and seventh row 20, fourth row 40 and tenth row 20, and fifth row 40 and twelfth row 20.

The interconnectivity shown in FIG. 3 is preferably such that each of the depicted conductors 230, 240, 250, 260, and 280 adjacent to a logic block 20 has a way to get to at least one conductor 300 to the left or right of that logic block. In addition, each conductor 230b and 250 has a way to get to at least one conductor 300 to the left or right of the logic block directly via a PLC 276 and without having to pass through a PLC 270. This last point is significant because conductors 230b and 250 are optimized for speed, and it is faster for a signal to get to a conductor 300 via only elements 276 and 278, rather than having to also pass through elements 270 and 274.

Figure 4:
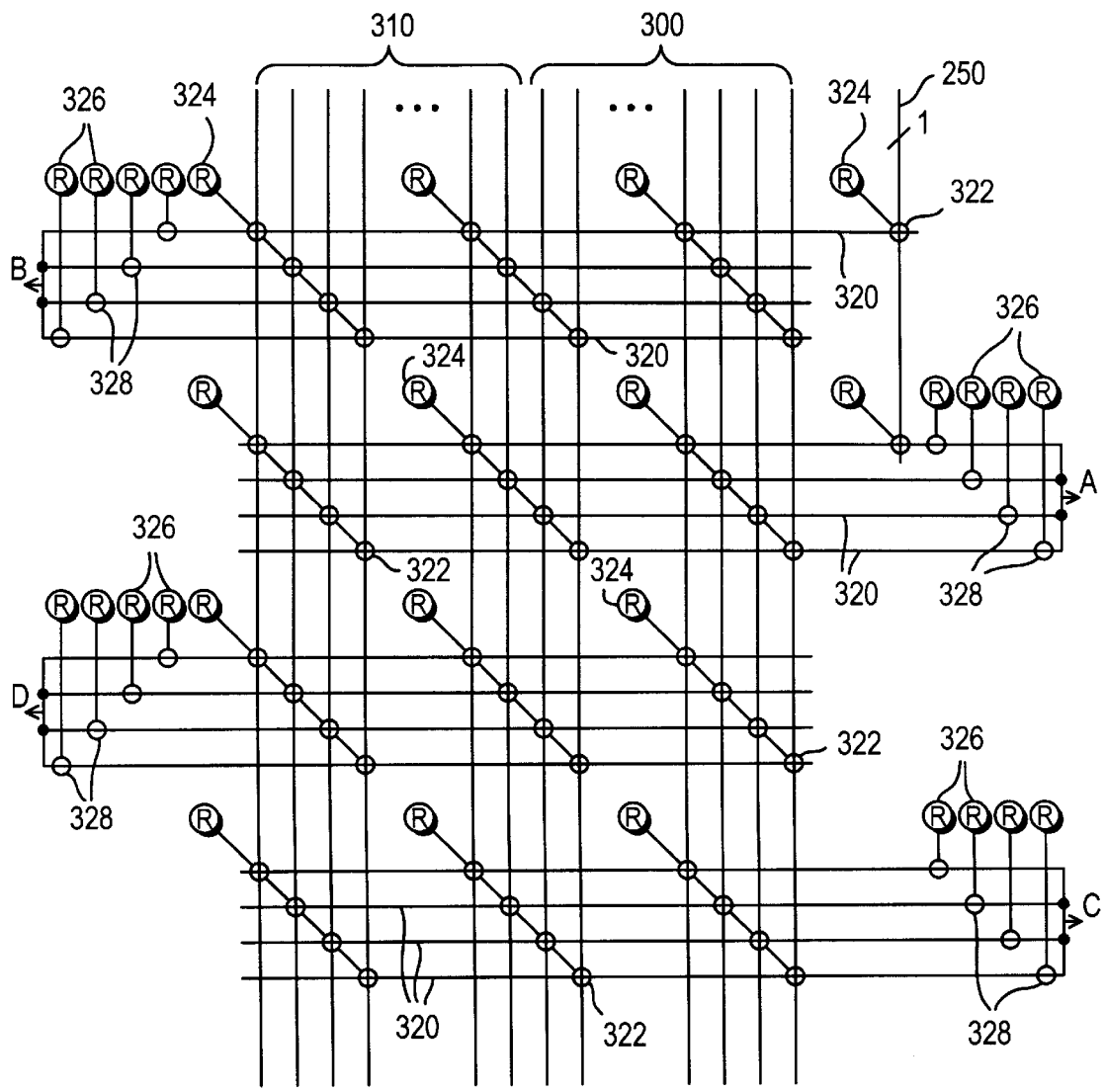
FIG. 4 is a simplified schematic block diagram of still other representative, illustrative interconnection resources for use on the device of FIGS. 1 and 2.

FIG. 4 shows representative conductors that are disposed between horizontally adjacent blocks 20 for bringing signals to those blocks from the other interconnection resources of the device and for providing local interconnections among the regions 30 in those blocks. Each group of such conductors includes 26 conductors 300 (whose signal sources are as shown in FIG. 3), a branch of one of the adjacent HNFL conductors 250, and ten local feedback conductors 310. Five of these local feedback conductors 310 receive their signals from five of the regions 30 in the block 20 to the left of the depicted conductor group. The other five of these conductors 310 receive their signals from five of the regions 30 in the block 20 to the right of the depicted conductor group.

Each region 30 has four main data signal inputs, sometimes referred to as inputs A–D. Any of conductors 300 and 310 can be used as the source(s) of the signals applied to the A and C inputs of the ten regions 30 to the right of those conductors, and as the source(s) of the signals applied to the B and D inputs of the ten regions 30 to the left of those conductors. Alternatively, the depicted HNFL conductor branch 250 can be used as the source of the signal applied to the A input of the top-most region to the right, and as the source of the signal applied to the B input of the top-most region to the left. Four intermediate conductors 320 are associated with each region input A–D. Each of the conductors 250, 300, and 310 that intersect these conductors 320 is connectable to one of the four conductors 320 that is associated with each input A–D. These connections are made by PLCs 322 that are controlled in groups of four by FCEs 324. (Exceptions to the group-of-four groupings are made for the connections to HNFL branch 250.) Thus a single FCE 324 is programmed to connect four conductors 300/310 to the four conductors 320 associated with each input A–D. A final selection of the signal applied to each input A–D is made by programming one of four FCEs 326 associated with that input to enable one of PLCs 328 associated with that input. (Alternatively, the signal on the HNFL branch 250 can be applied to an A or B input by appropriately programming associated FCEs 324 and 326.)

From the foregoing it will be seen that HNFL signals have two possible ways into the logic blocks 20 served by the conductors 300, etc., shown in FIG. 4. One of these ways is the relatively fast routing through elements 276 and 278 in FIG. 3. The other way, for one particular HNFL conductor 250 and the top-most ones of the regions 30 served by the conductors 300 shown in FIG. 4, is the even faster routing via the conductor branch 250 shown in FIG. 4 and the associated elements 322 and 328. Although somewhat slower, the first way is more general-purpose in that it enables any adjacent HNFL signal to get to at least large numbers of the inputs to the logic blocks 20 served by the circuitry shown in FIG. 4. The other, faster way is more limited in that it only works for one of the adjacent HNFL signals and only allows input to one input terminal of one region 30 in each of the logic blocks 20 served by the FIG. 4 circuitry.

Figure 5A:
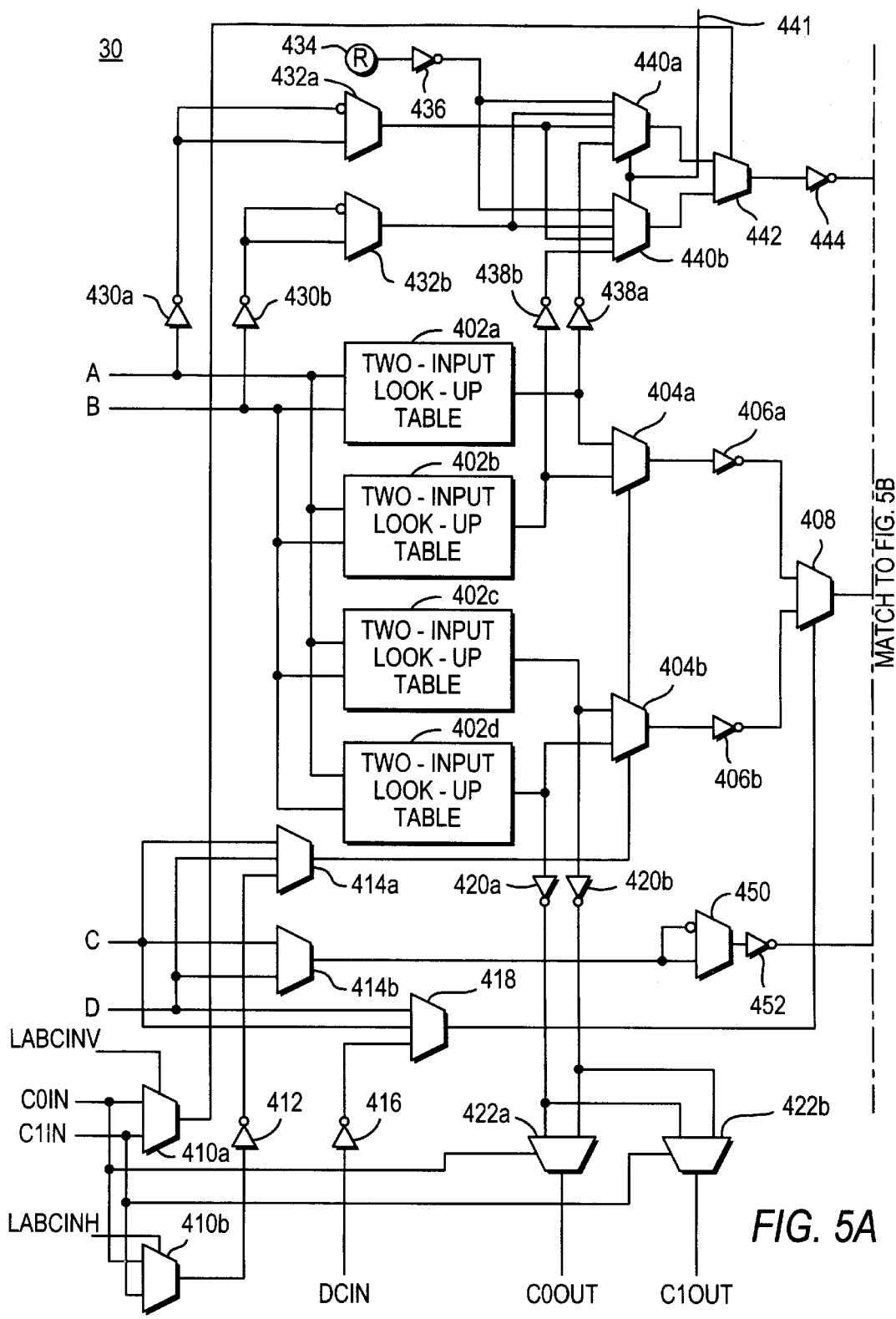
FIGS. 5A and 5B (sometimes referred to collectively as FIG. 5) are a simplified schematic block diagram of representative, illustrative programmable logic and related circuitry for use on the device of FIGS. 1 and 2 in accordance with the present invention.
Figure 5B:
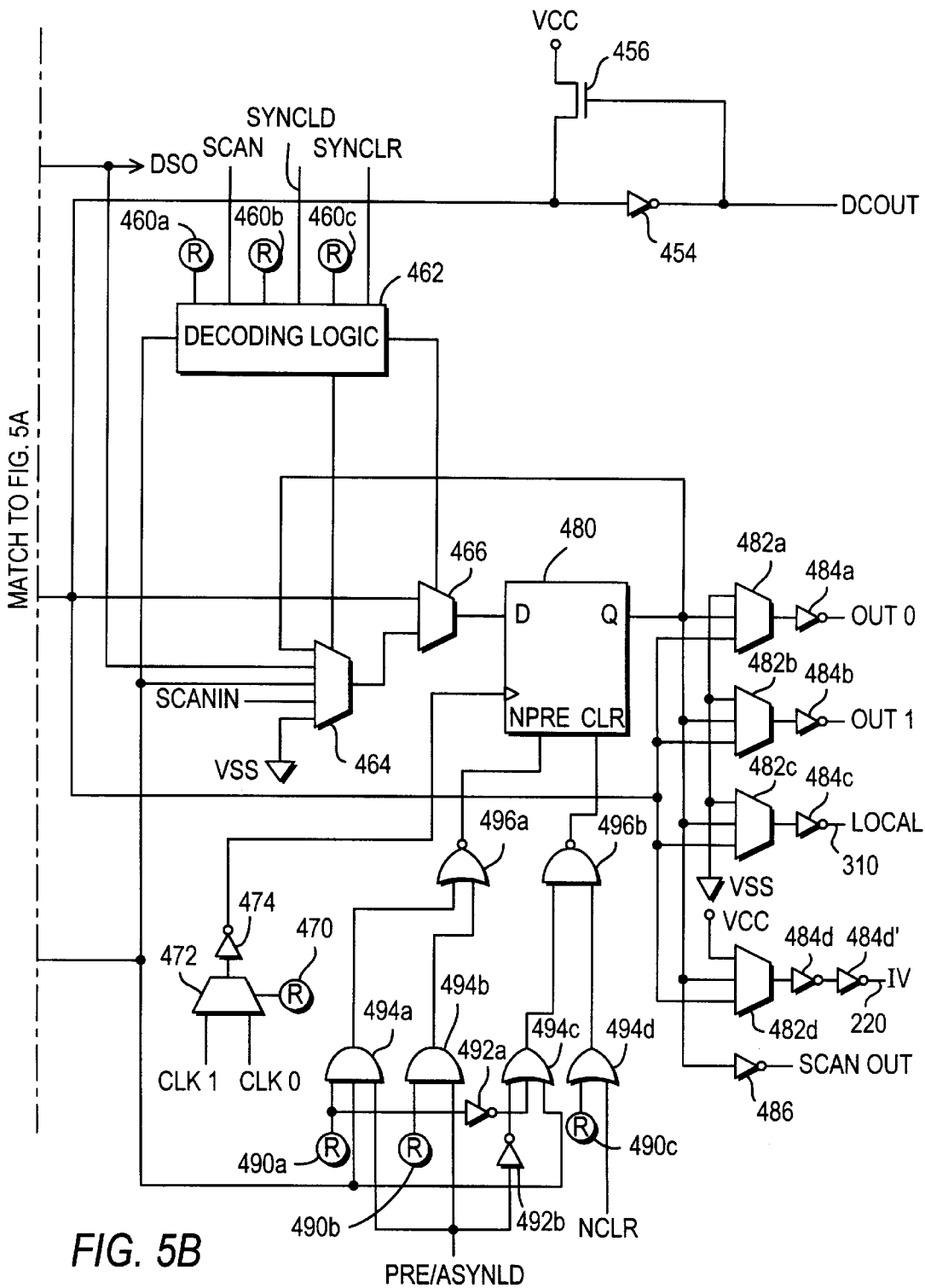

FIGS. 5A and 5B (sometimes referred to collectively as FIG. 5) show an illustrative embodiment of a representative region 30. The core of region 30 is a four-input look-up table (comprising elements 402, 404, 406, and 408) and a register 480. Although augmented with other features that are described below, the fundamental operation of region 30 is as a four-input look-up table which is programmable to produce a look-up table output signal (from PLC 408, which preferably is a multiplexer) which can be any logical combination of inputs A–D. The look-up table output signal can be output directly via any one or more of PLCs 482. Alternatively or in addition, the look-up table output signal can be registered by register 480 and then output via any of PLCs 482 that are not in use for outputting the unregistered look-up table output signal.

Considering representative region 30 in more detail, the first stage of the four-input look-up table logic is constructed as four two-input look-up tables 402a–402d. Each of look-up tables 402 receives region inputs A and B and is programmable to produce an output signal which is any logical combination of those two input signals. The second stage of the four-input look-up table logic is constructed as two PLCs 404a and 404b. PLCs (e.g., multiplexers) 404 can be controlled by (1) the C input to region 30, (2) the D input to region 30, or (3) a carry-in signal selected by PLC 410b. The selection among options (1), (2), and (3) is made by appropriately programming PLC 414a. Option (3) is selected if the region is being used to perform one place of certain binary arithmetic operations (e.g., fast adder, counter, multiplier, and wide parity functions). The selection between options (1) and (2) may be based on signal timing considerations which will be discussed further in connection with elements 406, 408, and 418. The output signals of PLCs 404a and 404b are strengthened by inverting buffers 406a and 406b, respectively.

The last stage of the four-input look-up table logic is performed by PLC (e.g., multiplexer) 408. PLC 408 can be controlled by (1) the C input to region 30, (2) the D input to region 30, or (3) a so-called "direct connect" input DCIN from another adjacent or nearby region 30. The selection among just-mentioned options (1), (2), and (3) is made by appropriately programming PLC 418. Option (3) will be selected if the depicted region 30 is performing a logic function that is based (at least in part) on receiving a direct connect signal from another adjacent or nearby region. These direct connect connections between regions may be used to facilitate the performance of wide fan-in logic functions or the like which require several regions to be connected in series, sometimes referred to as a cascade chain. (See, e.g., U.S. Pat. No. 5,258,668, which is hereby incorporated by reference herein in its entirety, for additional discussion of cascade connections between logic modules on programmable logic devices.) The choice between options (1) and (2) can be based on signal timing considerations.

The signal timing considerations referred to in the two preceding paragraphs can include routing the slowest (i.e., last-to-arrive) of the data signals to be processed by the four-input look-up table logic to the last stage of that logic (i.e., the control input terminal of PLC 408). In this way, the earlier-arriving data signals can be processed by the first two stages of the look-up table logic in order to produce two already-buffered signals at the output terminals of buffers 406a and 406b. Then when the last-to-arrive data signal is received, PLC 408 is immediately able to output the buffer output signal selected by the state of the last-to-arrive signal. By applying the last-to-arrive data signal to the last stage of the look-up table logic, the look-up table output signal can be made available significantly earlier than if the last-to-arrive signal were applied to an earlier stage of the look-up table. This speed-up of the look-up table is further enhanced by placing buffers 406 upstream from PLC 408, rather than having the final look-up table output signal delayed by a buffer downstream from PLC 408.

Above-described elements 414a and 418 allow either input C or input D to be selected as the one to be applied to the final stage of the look-up table. The input C or D that is not thus selected for the final stage can be applied to the next-to-last stage of the look-up table.

Because the direct connect signal DCIN may be relatively late to arrive (e.g., in the event that it is produced near the downstream ends of a relatively long cascade chain), this signal is also among those selectable by PLC 418 for application to the last stage of the look-up table logic. This again helps speed up cascade chains.

Continuing with discussion of other elements in FIG. 5A, if region 30 is being used to perform one place of binary addition, counting, or the like, elements 402a and 402b can be programmed to produce two precursors of the sum of input A, input B, and a carry-in signal (from PLC 410b). PLC 404a is then controlled by the carry-in signal (via PLC 414a) to select the appropriate one of these two precursors as the sum-out signal. PLC 408 is controlled to pass the sum-out signal to the circuitry of FIG. 5B. (This state of PLC 408 can be achieved by using the D input to the region to control PLC 408. Specifically, setting the D input to ground causes PLC 408 to select its top input.) Elements 402c and 402d are programmed to produce two precursors of the carry-out that results from summing input A, input B, and the carry-in signal. These two precursors are respectively inverted by buffers 420a and 420b and applied in parallel to the two data inputs of each of PLCs (e.g., multiplexers) 422a and 422b. PLCs 422a and 422b respectively select precursors to output as C0OUT and C1OUT based on the C0IN and C1IN signals applied to region 30. The C0OUT and C1OUT signals of each region 30 are the C0IN and C1IN signals of the next region 30 in the carry chain. Two carry signals are thus propagated in parallel as part of circuitry for speeding up carry chains. As stated above, in order to facilitate the long carry chains needed to implement the adder tree required to perform multiplication, the carry signals output by each region 30 are fed to the carry inputs of the region 30 immediately below, even if that next region 30 is in a different block 20.

Elements 450 and 452 are part of circuitry for allowing register 480 (FIG. 5B) to be used in what is called "lonely register" mode. This means that if register 480 is not needed for registering the look-up table output signal from PLC 408, the register can be alternatively used to register input C or input D. The C/D selection is made by PLC 414b. PLC 450 is programmed to propagate either the true or complement of the selected signal. Buffer 452 inverts and amplifies the selected signal.

Turning now to the portion of the representative region 30 circuitry that is shown in FIG. 5B, elements 454 and 456 allow the look-up table output signal (from PLC 408 in FIG. 5A) to be output as a direct connect output signal DCOUT of the region. The DCOUT signal of each region 30 is the DCIN signal of the next region in a cascade chain or series of regions. Element 454 is an inverting buffer for the DCOUT signal, and element 456 is part of level-restoring circuitry for that signal.

Elements 460 and 462 are circuitry for controlling the states of PLCs 464 and 466 based on the programming of elements 460, the logical state of the output signal of buffer 452 (FIG. 5A), and the logical states of the SCAN, SYNCLD, and SYNCLR signals. The SCAN signal is a device-wide signal for placing the device in a scan test mode in which register 480 and other registers on the device are effectively connected in scan chains in order to read out their contents and thereby more readily test the device for proper operation. Thus when the SCAN signal is asserted, decoding logic 462 controls PLCs 464 and 466 to apply the SCANIN signal to register 480. The SCANIN signal of each region 30 is the SCANOUT signal of the preceding region or other register circuitry in a scan chain. The Q output signal of register 480 is output via inverting buffer 486 as the SCANOUT signal of region 30.

SYNCLD and SYNCLR are signals that are preferably selected on a block-wide basis for the block 20 that includes region 30. These signals are used to cause decoding logic 462 to apply signals suitable for synchronous loading or synchronous clearing of register 480. For example, VSS (ground or logic 0) may be connected to the D input terminal of register 480 via PLCs 464 and 466 to cause synchronous clearing of the register. Other states of the inputs to logic 462 and the consequent outputs from that logic can cause register 480 to re-register its output signal, to register the so-called "direct sum-out"signal DSO from buffer 444 (FIG. 5A), or to operate in lonely register mode in which it registers the output signal of buffer 452 (FIG. 5A).

Elements 470, 472, and 474 allow either of two clock signals CLK0 or CLK1 to be selected as the clock signal applied to the clock input terminal of register 480. FCE 470 is programmed to cause PLC 472 to select one of the two clock signals, which is then inverted by inverting buffer 474 for application to register 480.

Elements 490–496 are programmable and otherwise operable to control register 480 to perform various preset, asynchronous load, and clear operations. Elements 490 are FCEs, elements 492 are inverters, elements 494a and 494b are AND gates, elements 494c and 494d are OR gates, element 496a is a NOR gate, and element 496b is a NAND gate. The PRE/ASYNLD signal is an asynchronous load control signal. The NCLR signal is a clear signal.

Each of PLCs 482a–c is programmable by FCEs (not shown) to output either VSS (logic 0), the Q output signal of register 480, or the unregistered look-up table output signal from PLC 408 (FIG. SA). PLC 482d is similar, except that instead of VSS, it can output VCC (logic 1). The output signal of PLC 482a is applied by inverting buffer 484a to a first output lead OUT0 of region 30. The output signal of PLC 482b is applied by inverting buffer 484b to a second output lead OUT1 of region 30. The output signal of PLC 482c is applied by inverting buffer 484c to a LOCAL output lead of region 30. The output signal of PLC 482d is applied by inverting buffers 484d and 484d' to an interleaved vertical ("IV") conductor 220.

The destinations of the OUT0 and OUT1 signals will be described below in connection with FIG. 6. The LOCAL signal is applied to a local feedback conductor 310 to the left or right of the block 20 that includes region 30. In particular, the LOCAL outputs of half the regions 30 in each block 20 are applied to respective ones of the conductors 310 to the left of that block and the LOCAL outputs of the other half of the regions in each block are applied to respective ones of the conductors 310 to the right of that block. In a manner somewhat like the LOCAL output signals, the IV output leads 220 of half the regions 30 in each block 20 extend upwardly from that block, and the IV output leads 220 of the other half of the regions extend downwardly from that block.

Elements 430, 432, 434, 436, 438, 440, 442, and 444 (for reasons to be explained below, each of these elements is provided in duplicate, with the respective reference numerals further identified with an "a" or a "b" to distinguish the duplicate occurrences) are provided as part of circuitry to facilitate and speed up the performance of multiplication operations by region 30 in accordance with the present invention. As explained above, and as described in more detail below, the initial partial products for one bit of any multiplication according to the present invention are formed by inputting one bit of one multiplicand, and that same bit shifted left one digit (multiplied by two), as two data inputs to a multiplexer, along with the corresponding bit of the sum of the bit and the shifted bit, with two bits of a second multiplicand being provided as control inputs to that multiplexer. However, the result of that operation may depend on a carry from a previous operation. In the preferred embodiment described herein (as described in copending, commonly-assigned U.S. patent application Ser. Nos. 60/142,511 and 09/516,865 which are hereby incorporated by reference herein in their entireties), in order to maximize speed, the operation is carried out twice simultaneously— once for each of the two potential values of the carry signal. The appropriate one of the two results is selected based on the actual value of the carry signal, which may arrive later. In this way, the entire operation is not held up by the delayed arrival of the carry signal.

Thus, a signal representing a bit of the first multiplicand may be provided at input A, and a signal representing a bit of the first multiplicand shifted left (multiplied by two) may be provided at input B. After passing through respective buffer 430a or 430b (to prevent multiplexers 432a and 432b from slowing down non-multiplier operations of region 30) and then having their trues and complements passed through respective multiplexers 432a or 432b (which function as programmable inverters to assure correct polarity of all signals), both of these two signals are input to both of multiplexers 440a and 440b. A third input to multiplexers 440a and 440b is programming bit 434 (for controlling programmable inversion of a further one-bit input to multiplexers 440a and 44b, which can have the effect of inverting the outputs of multiplexers 440a and 440b) which is buffered by inverter 436 (to prevent accidental flipping of bit 434 as a result of the capacitive loading of multiplexers 440a and 440b). A fourth input to multiplexers 440a and 440b is the output of two-input look-up tables 402a, 402b which are buffered by inverters 438a, 438b, and which preferably represents the sum of the first two inputs. The control signals for multiplexers 440a, 440b are two digits of the second multiplicand, provided on line 441, normally used (in a non-multiplication configuration) for signals that extend across group 20, as discussed above.

The truth table for each of multiplexers 440a, 440b is preferably as follows:

| B0 | B1 | OUT[15:0] |
|---|---|---|
| 0 | 0 | 0 |
| 1 | 0 | A[15:0] |
| 0 | 1 | A[15:0]*2 |
| 1 | 1 | A[15:0]+A[15:0]*2 | where B0 and B1 are bits of the second multiplicand B and are used as control signals of the multiplexers. In the context of the multiplexers 440a and 44b in a single logic region, the notation [15:0] signifies one of bits 0 through 15. It should be noted that although a preferred embodiment of the invention is a 16×16 multiplier, so that both A and B are 16-bit numbers, other sizes of multipliers can be provided in accordance with the invention, and therefore A and B can have any number of bits.

If the particular region 30 to which multiplexers 440a and 440b belong is being used for one of the initial partial products, then look-up tables 402a, 402b are used to form the sum of A[15:0] and A[15:0]*2. Each look-up table 402a, 402b assumes a different state of the carry-in to region 30. (For the very first bit, the carry-in is zero, meaning it is theoretically possible to use only one of look-up tables 402a and 402b, but it is easier, as a practical matter, to handle the first bit like any other bit and select the correct carry chain as described below.) The outputs of multiplexers 440a, 440b are bits of the possible sums (depending on the carry-in value) of the partial products of the first multiplicand with the two digits of the second multiplicand, as in the truth table above. Multiplexer 442 selects between the outputs of multiplexers 440a and 440b based on the actual value of carry-in signals C0IN and C1IN, selected under the control of signal LABCINV at multiplexer 410a.

If this particular region 30 is being used deeper in the adder tree, then it is being used to add bits of different sums of partial products (or sums of sums, etc.). In that case, the inputs at A and B are bits of the prior sums, which are added in look-up tables 402a, 402b. Here, the outputs of look-up tables 402a, 402b are buffered through inverters 438a, 438b to multiplexers 440a, 440b. The control input to multiplexer 442, which selects between the two different sums, is provided, as above, as carry-in signals C0IN and C1IN, selected under the control of signal LABCINV at multiplexer 410a. Inputs A and B also feed look-up tables 402c, 402d which compute carry-out precursor signals which are output by region 30, after buffering by inverters 420b, 420a, respectively, and selection in multiplexers 422*a*, 422*b* under the control of the carry-in signals C0IN, C1IN, as carry out signals C0OUT and C1OUT.

Whether partial products or sums are being computed, the output of multiplexer 442 is buffered by inverter 444 and is output at the dedicated sum output terminal DSO.

Because region 30 is provided with specialized components specifically for the purpose of performing operations associated with multiplication, the components used for other logic operations are little affected. Thus, not only is device 10 optimized for multiplication by the provision of those specialized components, but that optimization also imposes little if any penalty in the performance of those other operations.

Figure 6:
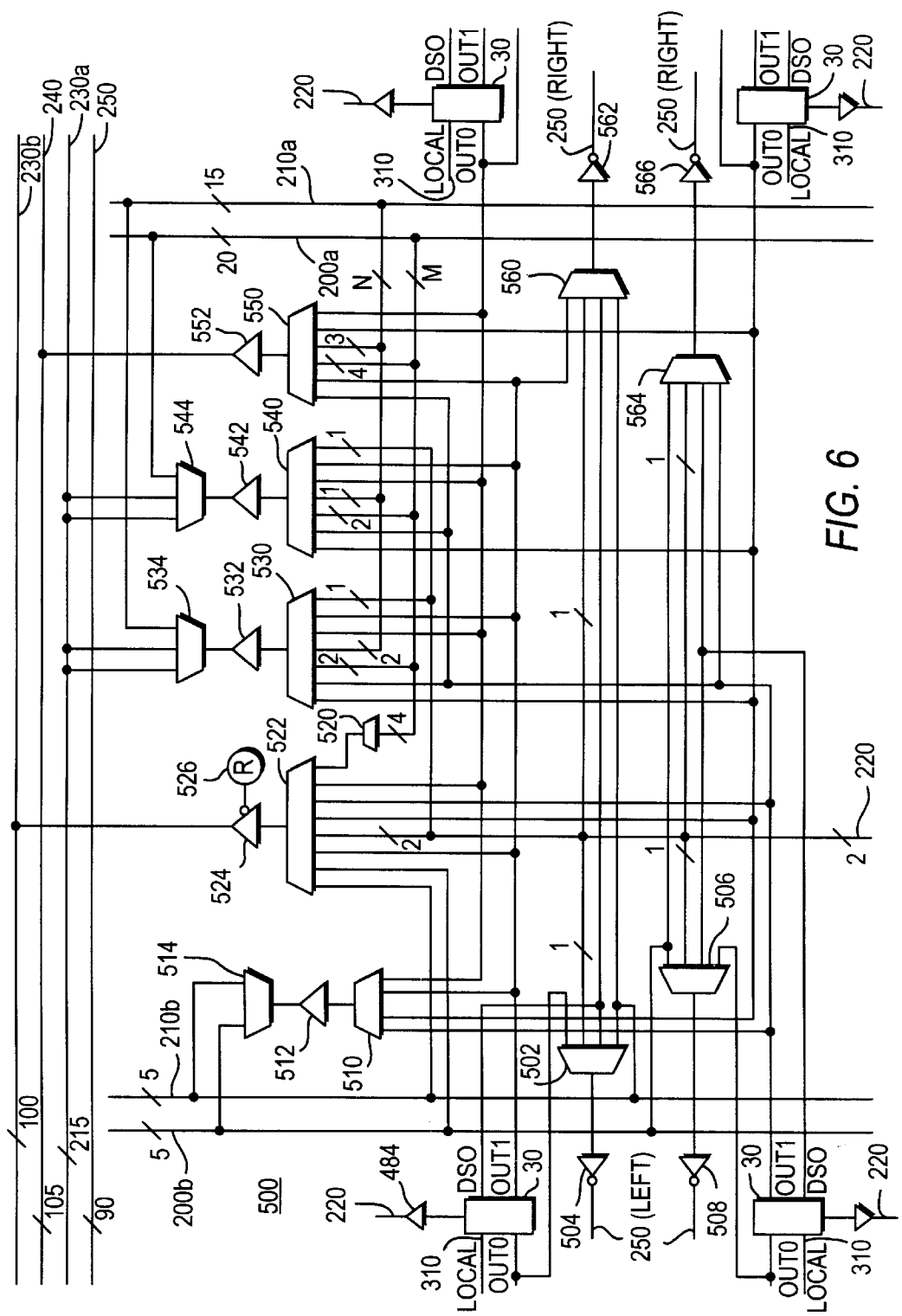
FIG. 6 is a simplified schematic block diagram of still more representative, illustrative interconnection resources for use on the device of FIGS. 1 and 2 in accordance with the present invention.

FIG. 6 shows representative circuitry for making connections from regions 30 to the interconnection conductors of device 10, as well as between various types of interconnection conductors. FIG. 6 may be characterized as showing a representative block 500 of driver circuitry. There preferably is such a block of driver circuitry associated with each group of four regions 30 that includes two regions from each of two horizontally adjacent blocks 20.

Considering first the various output signals of the upper region 30 on the left, the OUT0 signal of that region is applied to one input terminal of PLC 502. (Note that the OUT0 signal is also applied to the driver block to the left of the one shown in FIG. 6.) The other inputs to PLC 502 are (1) one of interleaved vertical signals 220 from a region 30 in the same column of blocks 20 but in the row of blocks above or below the row that includes the regions shown in FIG. 6, (2) the direct sum-out signal DSO from the same region 30 as supplies its OUT0 signal, and (3) one of the fast half vertical conductors 210*b* associated with the column of driver circuit blocks 500 that is shown in part in FIG. 6. PLC 502 is programmable (by FCEs that are not shown in FIG. 6) to select one of its four input signals for application to inverting buffer 504. The output signal of buffer 504 is applied to one of the HNFL conductors 250 in the group of such conductors that is centered on the column of blocks 20 that includes the regions shown on the left in FIG. 6. In particular, the output signal of buffer 504 is applied to an HNFL conductor segment 250 that extends to the left from that column of blocks 20. The output signal of inverting buffer 562 (discussed in more detail below) is applied to a segment of that same HNFL conductor 250 that extends to the right from that column of blocks 20. (Although the left- and right-extending segments of each HNFL conductor 250 are actually separate conductors that are separately drivable, they are sometimes collectively referred to as a single HNFL conductor 250.)

The OUT1 output signal of the upper left-hand region 30 in FIG. 6 is applied to one input terminal of each of PLCs 510, 522, 530, 540, 550, and 560. The other inputs to PLC 560 are the same as above-described inputs (1)–(3) to PLC 502. PLC 560 is programmable to apply any one of its four input signals to inverting buffer 562 for application to a rightwardly extending segment of an HNFL conductor 250 as described in the immediately preceding paragraph.

The so-called LOCAL output signal of the upper left-hand region 30 in FIG. 6 is applied to one of the adjacent local feedback conductors 310. The LOCAL output signals of half the regions 30 in each block 20 are applied to local feedback conductors 310 to the left of that region, and the LOCAL output signals of the other half of the regions in each block are applied to local feedback conductors 310 to the right of that region.

The IV output signal of the upper left-hand region 30 in FIG. 6 is applied to an IV conductor 220 that extends to the corresponding position in the row above the row that is partly shown in FIG. 6.

The destinations of the output signals of the lower left-hand region 30 in FIG. 6 are generally similar to those described above for the upper left-hand region. The OUT0 signal is one of the inputs to PLC 506. (Again, this OUT0 signal is also applied to another driver block 500 to the left.) The other inputs to PLC 506 are (1) a signal from an adjacent fast global vertical conductor 200*b*, (2) an IV signal 220, and (3) the direct sum-out signal of the lower left-hand region 30. PLC 506 is programmable to apply any one of its input signals to inverting buffer 508 for application to another adjacent, leftwardly extending HNFL segment 250.

The OUT1 signal of the lower left-hand block 30 is applied to one input of each of PLCs 510, 522, 530, 540, 550, and 564. The other inputs to PLC 564 are the same as above-described inputs (1)–(3) to PLC 506, and the output of PLC 564 is applied (via buffer 566) to the rightwardly extending segment of the same HNFL conductor 250 that buffer 508 drives. The LOCAL output signal of the lower left-hand region 30 is applied to an adjacent local feedback conductor 310. The IV output signal of the lower left-hand region 30 is applied to an IV conductor 220 that extends to a corresponding location in an adjacent row below the row that includes the circuitry shown in FIG. 6.

The OUT0 signal of the upper right-hand region 30 shown in FIG. 6 is applied to one input terminal of each of PLCs 510, 522, 530, 540, and 550. This signal is also applied to another similar driver block 500 to the right of the one shown in FIG. 6. The OUT1 and DSO output signals of the upper right-hand region 30 are also applied to the driver block to the right. The LOCAL output signal of the upper right-hand region 30 is applied to an adjacent local feedback conductor 310. The IV output signal of the upper right-hand region 30 is applied to an upwardly extending IV conductor 220.

The destinations of the output signals of the lower right-hand region 30 are generally similar. The OUT0 signal is applied to one input terminal of each of PLCs 510, 522, 530, 540, and 550, and to the driver block 500 to the right of what is shown in FIG. 6. The OUT1 and DSO signals are also applied to the driver block 500 to the right. The LOCAL output signal is applied to an adjacent local feedback conductor 310. And the IV output signal is applied to an IV conductor 220 extending down to a similar position in the adjacent row below the row that is shown in part in FIG. 6.

PLC 510 is programmable (by FCEs that are not shown) to select any one of its input signals for application to driver 512. The output signal of driver 512 is applied to PLC 514 (e.g., a demultiplexer) which is programmable by FCEs (not shown) to apply its input signal to any one of its output terminals. One output terminal of PLC 514 is connected to an adjacent fast global vertical conductor 200*b*. The other output terminal of PLC 514 is connected to an adjacent fast half vertical conductor 210*b*. From the foregoing it will be seen that elements 510, 512, and 514 make it possible to connect any one of the OUT1 signals of the regions 30 on the left or the OUT0 signals of the regions 30 on the right to either one of an adjacent fast global vertical conductor 200*b* or an adjacent fast half vertical conductor 210*b*. Thus elements 510, 512, and 514 allow any of the four regions 30 served by the driver block 500 shown in FIG. 6 to drive either a fast global vertical conductor 200*b* or a fast half vertical conductor 210*b*.

The inputs to PLC 522 that have not already been described are as follows: (1) a signal from one of adjacent fast global vertical conductors 200*b*, (2) a signal from one of adjacent fast half vertical conductors 210b, (3) two interleaved vertical conductor signals 220 (one of which comes from the row above the row shown in part in FIG. 6, and the other of which comes from the row below the row shown in part in FIG. 6), and (4) a signal from one of four adjacent global vertical conductors 200a (the selection of that one-signal-of-four being made by PLC 520). Like other PLCs on device 10, PLC 522 is programmably controlled by FCEs (not shown) to select any one of its inputs for application to tri-state driver 524. Tri-state driver 524 is programmably controlled by FCE 526 to be either off (high output impedance) or on (able to pass and amplify the applied data input signal). The output signal of tri-state driver 524 is applied to an adjacent one of fast global horizontal conductors 230b. From the foregoing it will be seen that elements 522, 524, and 526 allow an output signal of any of the regions 30 served by the driver block 500 shown in FIG. 6 to be driven onto one of the adjacent fast global horizontal conductors 230b. Alternatively, elements 522, 524, and 526 allow a signal from either an adjacent fast global vertical or fast half vertical conductor 200b or 210b to make a turn and be driven onto the above-mentioned fast global horizontal conductor 230b. As still another alternative, elements 522, 524, and 526 allow either of two interleaved vertical conductor signals 220 to be driven onto the above-mentioned fast global horizontal conductor 230b. And as a final alternative, elements 520, 522, 524, and 526 allow any one of four adjacent global vertical conductor signals 200a to make a turn and be driven onto the above-mentioned fast global horizontal conductor 230b.

Considering now the inputs to PLC 530 that have not already been discussed, two of the four signals that are applied to PLC 520 are also applied to PLC 530, as are signals from two of the adjacent half vertical conductors 210a. One of the interleaved vertical conductor signals that are applied to PLC 522 is also applied to PLC 530. Like other PLCs on device 10, PLC 530 is programmably controlled by FCEs (not shown) to apply any one of its inputs to driver 532 for amplification by that device. The output signal of driver 532 is applied to PLC 534 (e.g., a demultiplexer). PLC 534 is programmably controlled by FCEs (not shown) to apply its input signal to any one of its output leads. Two of the output leads of PLC 534 are respectively connected to two of the adjacent global horizontal conductors 230a. The third output lead of PLC 534 is connected to an adjacent half vertical conductor 210a. From the foregoing it will be seen that elements 530, 532, and 534 can be used to drive an output signal of any of the four regions 30 shown in FIG. 6 out to adjacent ones of regular (normal-speed) horizontal and vertical conductors 230a and 210a. Alternatively, elements 530, 532, and 534 can be used to drive a signal from adjacent regular (normal-speed) conductors 200a and 210a or from an interleaved vertical conductor 220 onto a regular horizontal or vertical conductor 230a or 210a. Thus elements 530, 532 and 534 can be used, for example, to enable a signal to make a turn from a regular vertical conductor to a regular horizontal conductor.

The inputs to and outputs from elements 540, 542 and 544 are generally similar to those described above for elements 530, 532 and 534. The only differences are (1) a different one of the conductors 220 is connected to PLC 540 than to PLC 530, (2) only one of conductors 210a is connected to PLC 540, and (3) the third output of PLC 544 is applied to an adjacent global vertical conductor 200a rather than to a half vertical conductor 210a. Nevertheless, elements 540, 542 and 544 provide more of the same basic type of routing capability that elements 530, 532 and 534 provide.

The inputs to PLCs 550 that have not already been considered are signals from four of the adjacent conductors 200a and from three of the adjacent conductors 210a. Like other similar PLCs on device 10, PLC 550 is programmable (by FCEs that are not shown) to select any one of the applied signals for application to driver 552. Driver 552 amplifies the signal it receives and applies the amplified signal to one of the adjacent direct horizontal conductors 240. Thus elements 550 and 552 allow any of the regions 30 shown in FIG. 6 or any of several adjacent vertical conductors 200a or 210a to drive an adjacent direct horizontal conductor 240. For example, elements 550 and 552 can be used to enable a signal to turn from a vertical conductor 200a or 210a to a horizontal conductor 240.

Figure 7:
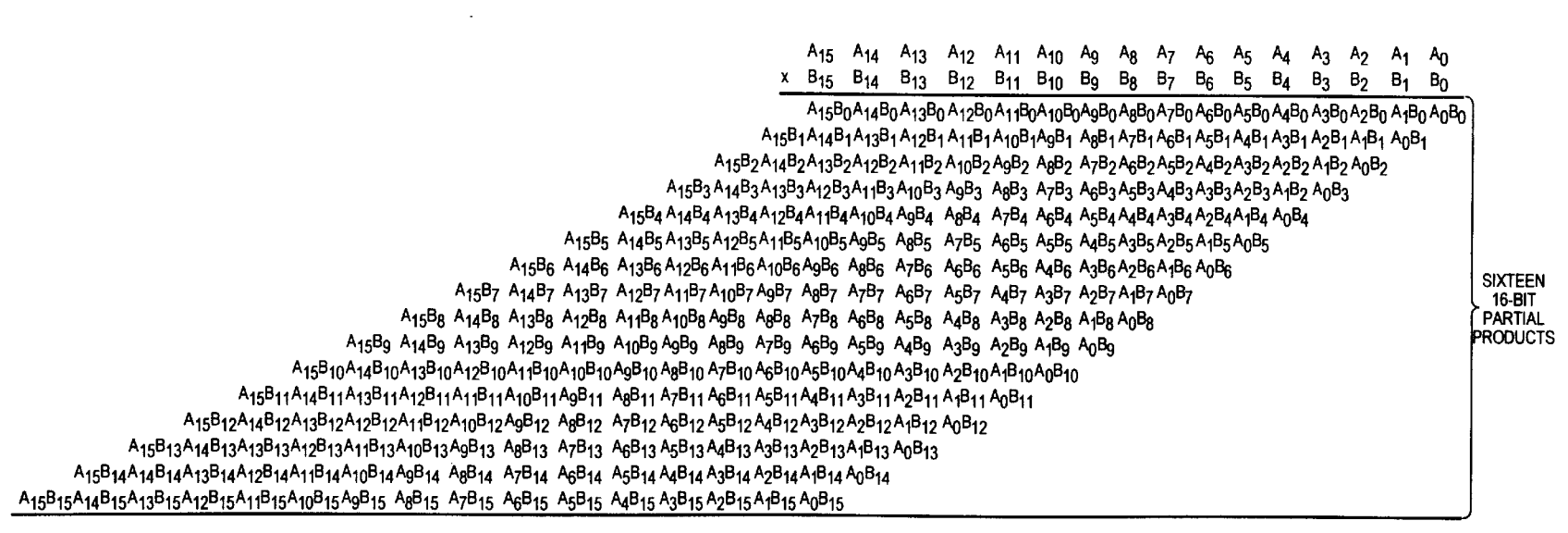

In order to understand how these connections are used to implement a multiplier, it is necessary to understand with particularity how multiplication is performed. For this purpose, one can consider the multiplication of two sixteen-bit numbers, A[15:0] and B[15:0]. FIG. 7 shows how such a multiplication ordinarily is performed, whether binary, digital, or in some other base. Thus, as shown in FIG. 7, two sixteen-digit numbers are being multiplied, forming sixteen sixteen-digit partial products, each digit of which is a product of one digit from multiplicand A and one digit from multiplicand B. Those partial products are then summed (result not shown in FIG. 7).

Figure 8:
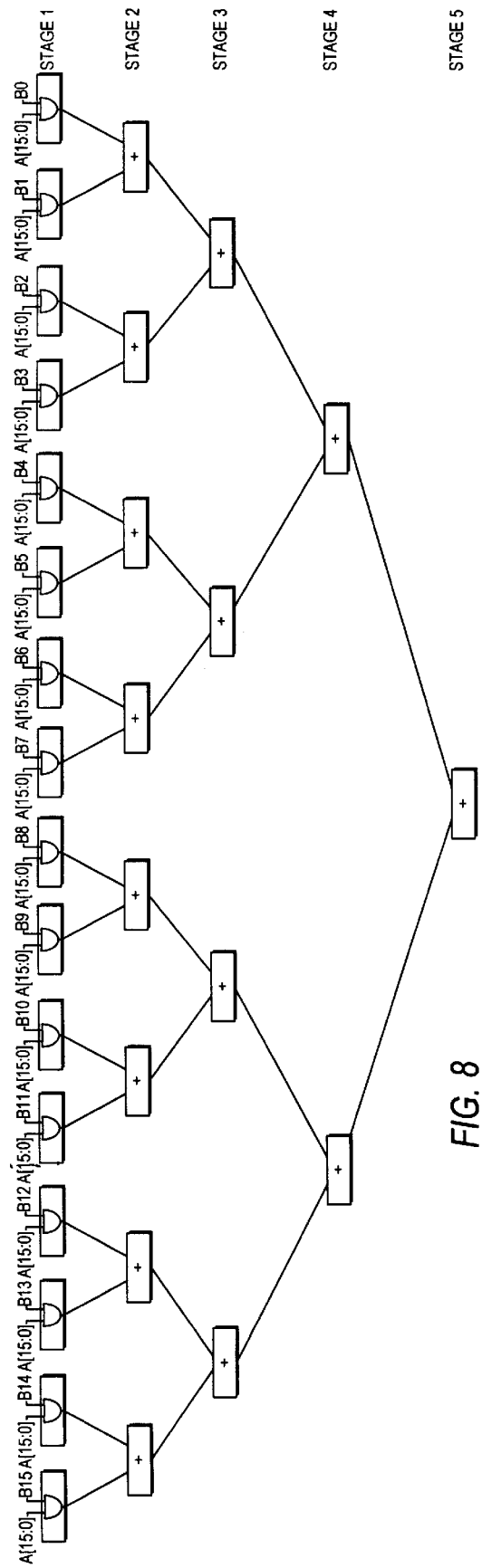
FIG. 8 is a diagram of a binary adder tree for implementing the multiplication operation of FIG. 7.

FIG. 8 shows how this process can be diagramed as a well-known binary adder tree. In what is labelled "Stage 1," the partial products are formed in sixteen separate operations as each digit of multiplicand B is multiplied by all digits of multiplicand A, separately from other digits of multiplicand B. Stages 2–5 show successive stages of addition of adjacent partial products or sums of partial products.

Figure 9:
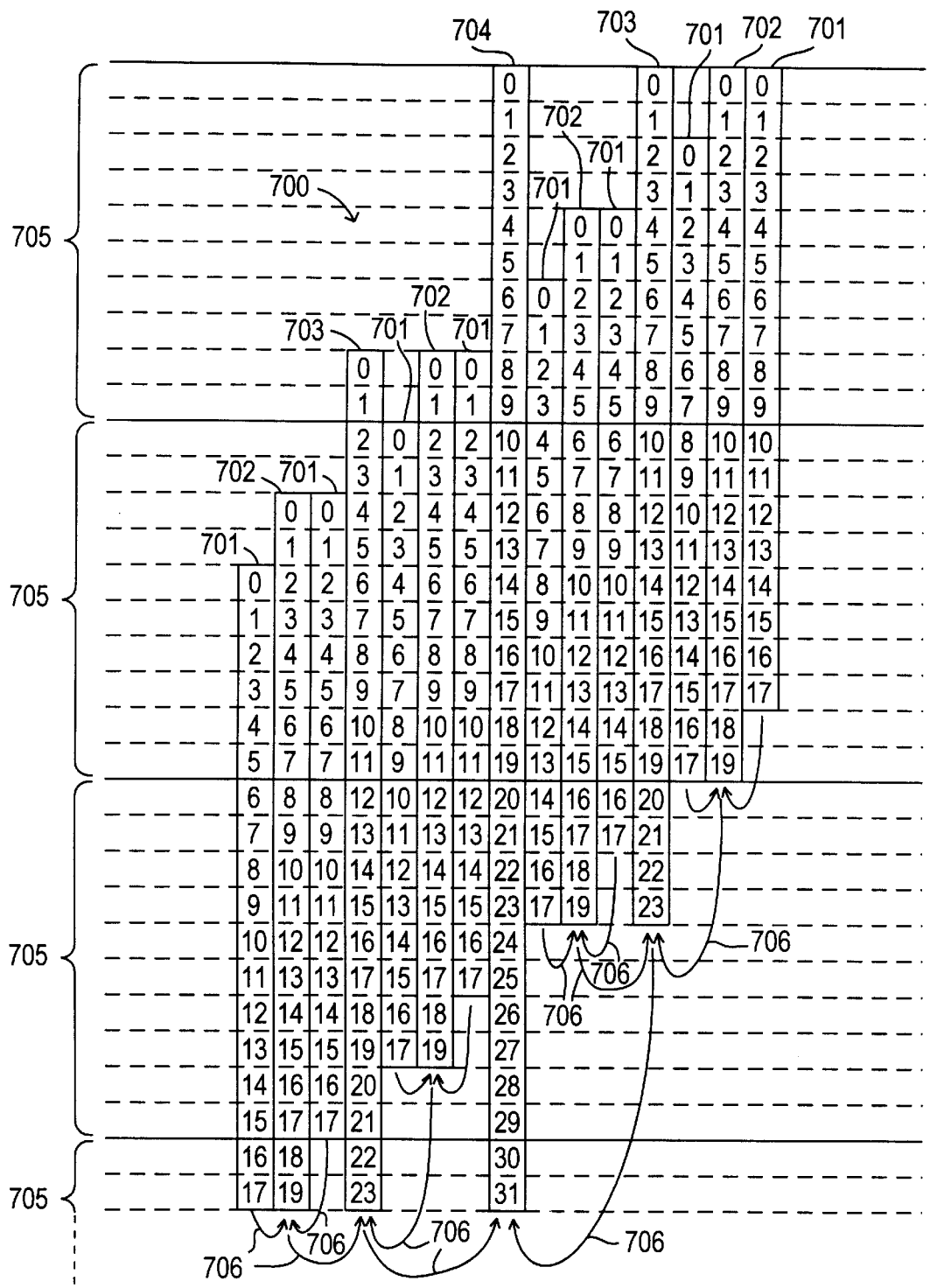
FIG. 9 is a simplified schematic diagram showing the layout of a multiplier on the device of FIGS. 1 and 2 in accordance with the present invention.

In the present invention, Stages 1 and 2 are combined, as multiplexers 440a, 440b in each region 30 produce a sum of the partial products of one digit of A and two separate digits of B. Therefore, three further addition stages, corresponding to Stages 3–5, must be performed. To perform these addition stages most efficiently, the logic should be laid out on device 10 in a way that minimizes the distance that signals must travel. This can be visualized by the diagram in FIG. 9, in which each column represents a column of regions 30, each such column representing the result of one stage of the multiplication operation. In particular, columns 701 represent the results of combined Stages 1 and 2—i.e., the initial sum of partial products. Columns 701 are eighteen regions 30 high, rather than sixteen, because FIG. 9 shows the layout for signed multiplication, and two additional bits—hence two additional regions 30—must be used to include the sign information. Each column 701 is offset two rows from the previous column 701, representing the lining up of digits of equal significance in the summation shown in FIG. 7. This lining up eliminates the need to conduct signals (other than carry signals) vertically within tree 700.

Columns 702 represent the sums of adjacent pairs of columns 701, and each column 702 is twenty regions 30 high. Columns 703, each of which is twenty-four regions 30 high, represent the sums of adjacent pairs of columns 702. Column 704, which is thirty-two regions 30 high, represents the final sum. Rows 705, signifying the height of one block 20, show the importance of allowing the carry outputs of each region 30 to communicate with the next region 30 below it, even if that region 30 is in a different block 20, as the full tree 700 extends over portions of four rows (i.e., each column includes logic regions 30 from up to four different logic blocks 20).

The curved arrows 706 at the bottoms of the various columns in FIG. 9 show which columns are added together.

On device 10, these arrows preferably translate to the use of HNFL conductors 250, reached by the dedicated sum outputs. While tree 700, as shown in FIG. 9, is fifteen columns wide and, as discussed above, HNFL conductors 250 span 11 regions 30, five on either side of the originating region 30, it can be seen from FIG. 9 the greatest number of regions 30 that a signal must span is four—from column 703 to column 704. FIG. 6 shows how the DSO output of each region 30, used for this multiplication operation, reaches that region's HNFL conductor 250. (It should be noted, however, that, if desired, the output can be routed instead, or also, to register 480 of region 30 as shown in FIG. 5B.)

In accordance with a preferred embodiment of the invention, particular HNFL lines are provided with direct connections to particular regions 30 in particular blocks 20. The pattern of such connections provided is precisely the pattern that would be needed should a user desire to program device 10 with an adder tree for a sixteen-bit by sixteen-bit multiplier. Thus, if the odd-numbered blocks 20 are used to perform the partial products and the even-numbered blocks 20 are used to constitute the adder tree, the A or left input to each region 30 in the 2Nth block 20 is provided with a direct connection to an HNFL line driven by a corresponding region 30 in the (2N−0.5Q(2N))th block 20, while the B or right input to each region 30 in the 2Nth block 20 is provided with a direct connection to an HNFL line driven by a corresponding region 30 in the (2N+0.5Q(2N))th block 20, where Q(2N) is the largest integral power of 2 that evenly divides 2N. Examination of the pattern of curved arrows 706 shows that that pattern fits the distribution of direct connections as just described. For example, in the fourteenth column (N=7; 2N=14), the largest power of 2 that evenly divides 14 is 2, so 2N±0.5Q(2N)=14±0.5(2)=14±1. Examination of FIG. 9 shows that the column 14 is in fact fed by columns 13 and 15. The odd-numbered blocks 20, which perform the partial products, do not need, and are not provided with, direct HNFL connections.

Curved arrows 706 also could represent dedicated connections that, in an alternative embodiment, could be provided to perform the necessary sums. Because tree 700 is fifteen columns wide, it can be provided multiple times on device 10, repeating every fifteen columns, providing flexibility for the layout of a multiplier by the programming software for device 10, and also allowing several multipliers to be provided on a single device 10 if desired by the user.

Whether dedicated direct connections are provided or special connections to HNFL lines, as described, are provided on device 10 to facilitate construction of an adder tree, these connections are faster than connections that use the interconnect resources shown in FIGS. 3 and 4, which go through an extra programming stage and experience extra line loading.

Figure 10:
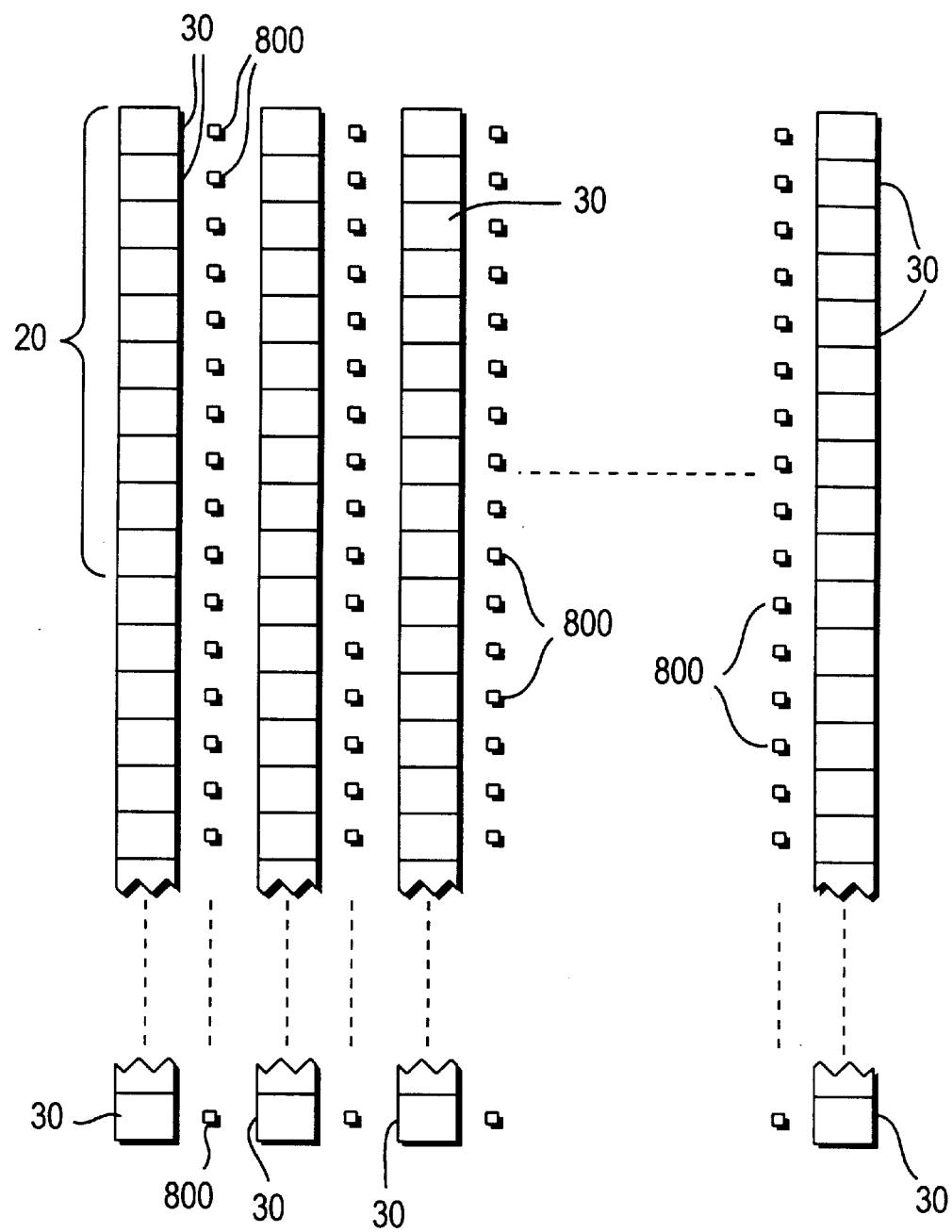
FIG. 10 is a simplified block diagram, similar to FIG. 1, of an alternative embodiment of an illustrative programmable logic device in which the present invention can be used, incorporating full adders.

As a further alternative to using columns of regions 30 to construct addition tree 700, dedicated adders 800 could be provided between each column of regions 30 on device 10, as shown in FIG. 10. In such an embodiment, the dedicated sum output DSO (which is provided specifically for the multiplier case) of a given region 30 would directly connect to an appropriate one of adders 800. In that embodiment, it would not be necessary to intersperse the columns performing sums of partial products with columns performing simple addition. Instead, all columns used in the multiplier would be performing sums of partial products. Those adders receiving input from regions 30 would direct their outputs to further adders through either a direct HNFL connection, or through a true dedicated connection provided for that purpose. While additional device area would be occupied by the adders 800, and interconnection resources as just described would be required to conduct the intermediate sums produced by adders 800 to other adders to produce the final result, there would be a savings in the number of columns of logic regions 30 that would be used in at least multiplication operations, thereby increasing the effective size of device 10, or alternatively allowing fewer regions 30 to be provided for the same functionality, balancing the additional area consumed by adders 800 and the use of additional interconnection resources.

The specific pattern in a particularly preferred embodiment is as follows. The output of a region 30 in an odd-numbered block 20 directly feeds the first input of a dedicated adder 800 to its right. The output of a region 30 in an even-numbered block 20 directly feeds the second input of a dedicated adder 800 to its left. This would account for all odd-numbered columns of adders 800. The pattern is actually the same as that in FIG. 9 if, for purposes of numbering the columns, columns of adders and columns of logic are all numbered as columns. The pattern for all columns is as follows: The left input to each adder 800 in the 2Nth column is provided with a direct connection through an HNFL or dedicated line to an output of a corresponding adder 800 or logic region 30 in the (2N−0.5Q(2N))th column, while the right input to each adder 800 in the 2Nth column is provided with a direct connection through an HNFL or dedicated line to an output of a corresponding adder 800 or logic region 30 in the (2N+0.5Q(2N))th column, where Q(2N) is the largest integral power of 2 that evenly divides 2N. (Note that all adders are in even columns—i.e., columns numbered "2N"; in the discussion above with respect to odd- and even-numbered columns of adders, "odd" and "even" refer to whether N is odd or even).

Figure 11:
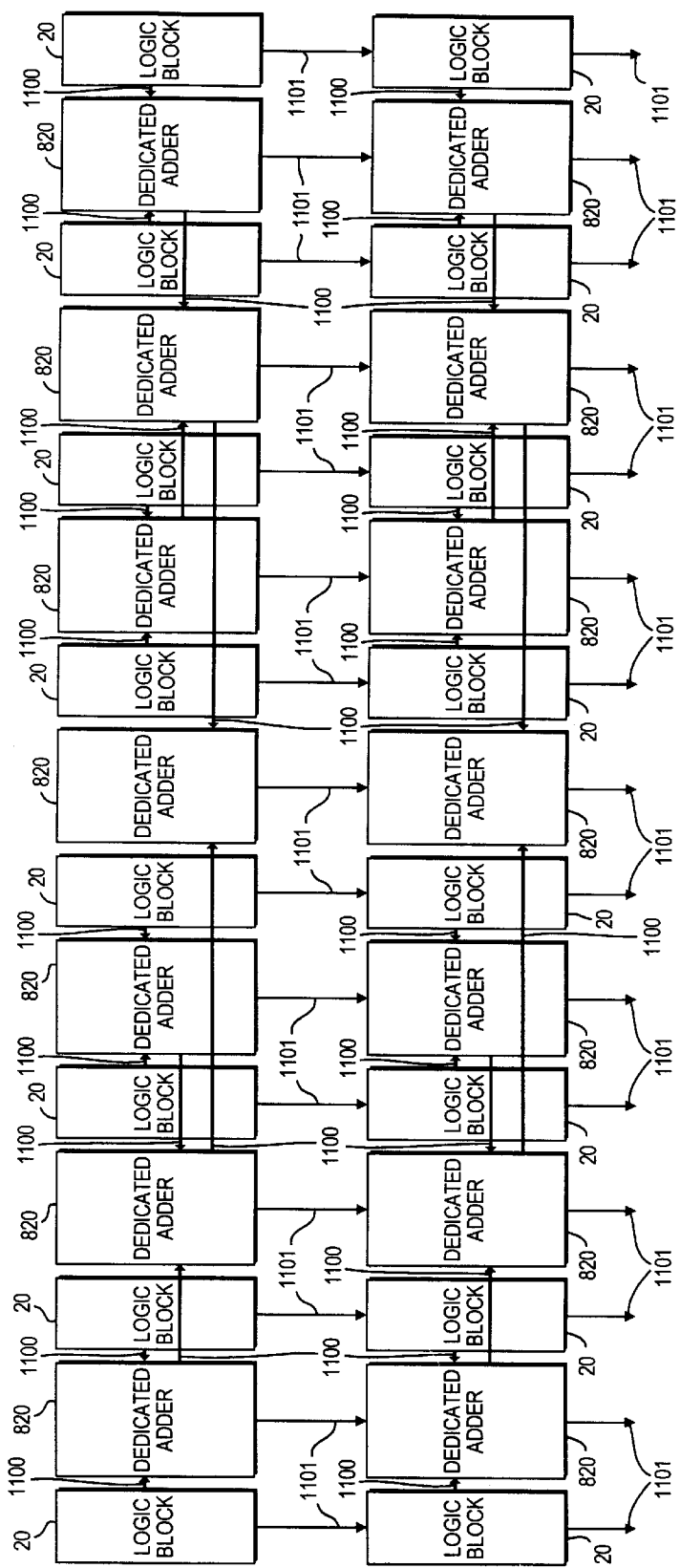
FIG. 11 is a schematic view of a preferred embodiment of an interconnection pattern for the full adders used in the programmable logic device of FIG. 10.

This interconnection pattern is shown in FIG. 11, which shows two rows of logic blocks 20 and adder blocks 820. Each adder block 820 includes the same number of adders 800 as there are logic regions 30 in each logic block 20. Each of the heavy arrows 1100 represent that same number of direct connections between individual logic regions 30 and corresponding individual adders 800. Connections 1100 can be dedicated direct connections, or HNFL connections reached by DSO connections, as described above. Arrows 1101 represent carries across logic block boundaries from the last logic region 30 in each logic block 20 to the first logic region 30 in the next logic block 20 as discussed above.

Figure 12:
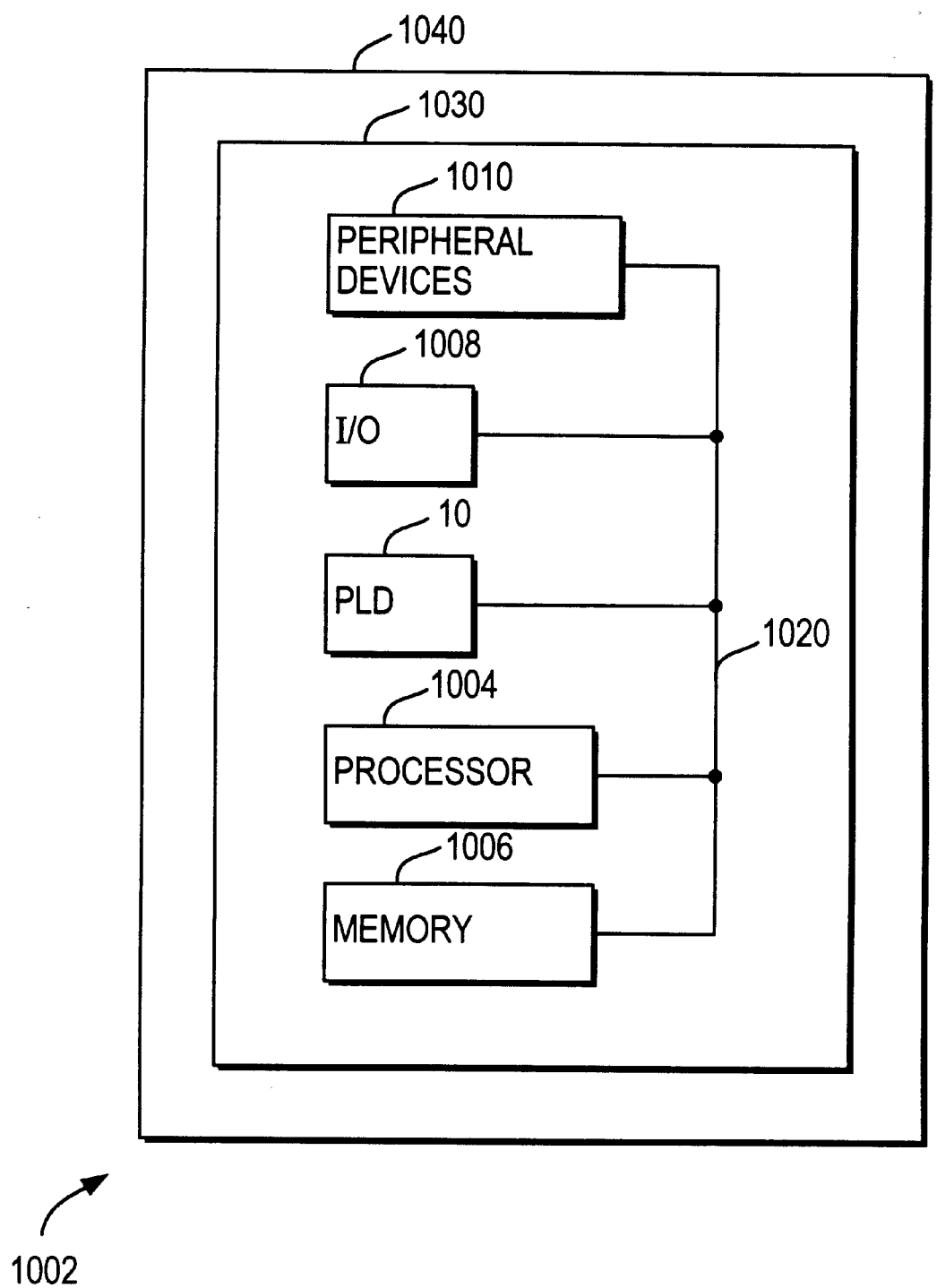
FIG. 12 is a simplified block diagram of an illustrative system employing a programmable logic device in accordance with the invention.

FIG. 12 illustrates a programmable logic device 10 of this invention in a data processing system 900. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 901. Programmable logic device 10 may also be used as an arbiter for arbitrating access to a shared resource in system 900. In yet another example, programmable logic device 10 can be configured as an interface between processor 901 and one of the other components in system 900. It should be noted that system 900 is only exemplary, and that the true scope and spirit of the invention should be indicated by the following claims.

Various technologies can be used to implement programmable logic devices 10 having the features of this invention, as well as the various components of those devices (e.g., the above-described PLCs and the FCEs that control the PLCs). For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product-term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the various components of PLCs can be controlled by various, programmable, function control elements ("FCEs"). (With certain PLC implementations (e.g., fuses and metal optional links) separate FCE devices are not required.) FCEs can also be implemented in any of several different ways. For example, FCEs can be SRAMS, DRAMs, first-in first-out ("FIFO") memories, EPROMs, EEPROMs, function control registers (e.g., as in U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the foregoing is only illustrative of the principles of the invention, and that various modifications can be made by those skilled in the art without departing from the scope and spirit of the invention. For example, the numbers of the various types of resources on device 10 can be different from the numbers present in the depicted and described illustrative embodiment. This applies to such parameters as the numbers of rows and columns of the various types of circuitry, the number of regions 30 in each block 20, the numbers of the various types of interconnection conductors, the numbers and sizes of the PLCs provided for making interconnections between various types of interconnection conductors, etc. It will also be understood that various directional and orientational terms such as "vertical" and "horizontal," "left" and "right," "above" and "below," "row" and "column," and the like are used herein only for convenience, and that no fixed or absolute directional or orientational limitations are intended by the use of these words. For example, the devices of this invention can have any desired orientation. If reoriented, different directional or orientational terms may need to be used in their description, but that will not alter their fundamental nature as within the scope and spirit of this invention. Terms like "block" and "region" are also used only as generic, relative terms, and other terms may be used for generally similar circuitry. Alternatively, devices within the scope of this invention may have blocks of programmable logic that are not divided into regions. Although look-up table logic is employed in the illustrative embodiment shown and described herein, it will be understood that other types of logic may be used instead if desired. For example, sum-of-products logic, such as is the primary example considered in, e.g., U.S. Pat. Nos. 5,241,224 and 5,371,422 (both of which are hereby incorporated by reference herein in their entireties), may be used instead of look-up table logic.

Thus it is seen that a programmable logic device optimized to perform multiplication operations, and to perform such operations little or no speed penalty in the performance of logic operations, has been provided. One skilled in the art will appreciate that the present invention can be practiced by other than the described embodiments, which are presented for purposes of illustration and not of limitation, and the present invention is limited only by the claims which follow.

What is claimed is:

1. A programmable logic device comprising:
   a plurality of regions of programmable logic, each having a plurality of input terminals and at least one output terminal, and each being programmable to selectively perform any of a plurality of logic functions on input signals applied to the input terminals to produce an output signal applied to the output terminal; and
   an interconnection network which is programmable to selectively connect the output terminal of substantially any of the regions to at least one of the input terminals of substantially any of the regions; wherein:
   each region in at least a subset of said plurality of regions of programmable logic has additional logic dedicated to the performance of functions forming at least part of a multiplication operation; and
   said additional logic comprises a first logic unit for performing at least portions of both (i) two partial products of two multiplicands and (ii) summing said two partial products.

2. The programmable logic device of claim 1 wherein said first logic unit comprises a multiplexer having as inputs (a) at least one bit of one of said two multiplicands and (b) at least one bit of the product of 2 and said one of said two multiplicands, and having as control signals at least one digit of another of said two multiplicands.

3. The programmable logic device of claim 2 wherein said multiplexer further has as an input (c) a sum of said input (a) and said input (b).

4. The programmable logic device of claim 3 wherein said sum of said input (a) and said input (b) is formed in said programmable logic region.

5. The programmable logic device of claim 3 wherein said multiplexer further has as an input (d) a single programmable bit.

6. The programmable logic device of claim 2 wherein said multiplexer has as control signals two said digits.

7. The programmable logic device of claim 1 wherein at least one input of said additional logic is programmably invertible for inversion of output of said additional logic.

8. The programmable logic device of claim 1 wherein:
   said region has a plurality of inputs for applying said input signals on which said logic functions are performed and for applying signals common to a plurality of said regions; and
   when said additional logic is in use, input signals to said additional logic are applied to one or more of said plurality of inputs.

9. The programmable logic device of claim 8 wherein at least one of said input signals to said additional logic is applied to at least one of said inputs for applying signals common to a plurality of said regions.

10. The programmable logic device of claim 1 wherein said additional logic further comprises:
    a second said logic unit, said first logic unit performing said sum of partial products assuming a first value of a carry from another said region, and said second logic unit performing said sum of partial products assuming a second value of said carry;
    a carry input for said carry from said another said region; and a carry select unit for selecting said sum of partial products from one of said first and second logic units based on whether said carry has said first value or said second value.

11. The programmable logic device of claim 1 wherein said additional logic has a dedicated sum output separate from said output terminal.

12. The programmable logic device of claim 1 wherein:

said regions are arranged in rows and columns;

said additional logic produces a carry value, and includes a dedicated carry input for receiving a carry value from additional logic of another said region and a dedicated carry output for sending a carry value to additional logic of another said region; and said interconnect network includes dedicated carry connections connecting said dedicated carry output of one of said regions to said dedicated carry input of another of said regions directly below said one of said regions.

13. The programmable logic device of claim 12 wherein:

said regions are arranged in groups on said programmable logic device; and each said region has one of said dedicated carry connections, regardless of whether said one of said dedicated carry connections extends between groups of said regions.

14. The programmable logic device of claim 1 wherein:

said multiplication is performed by summing sums of partial products from a particular number of said regions; and said interconnect network includes dedicated connections among a selected number of said regions for performing said summing of sums.

15. The programmable logic device of claim 14 wherein:

said regions are arranged in columns;

among a group of said columns of said regions programmed to perform multiplication, said selected number of said regions are in even-numbered ones of said columns;

a left input to each of said selected number of regions in a column numbered 2N is provided with one of said dedicated connections to an output of a corresponding logic region located 0.5Q(2N) columns left of said column numbered 2N; and a right input to each of said selected number of regions in said column numbered 2N is provided with one of said dedicated connections to an output of a corresponding logic region located 0.5Q(2N) columns right of said column numbered 2N;

where Q(2N) is a largest integral power of 2 that evenly divides 2N.

16. The programmable logic device of claim 1 wherein:

said multiplication is performed by summing sums of partial products from a particular number of said regions; and said programmable logic device further comprises a plurality of dedicated adders for adding sums of partial products produced by said regions.

17. The programmable logic device of claim 16 wherein:

said regions and said adders are arranged in alternating columns;

among a group of said columns of said regions programmed to perform multiplication, said adders are in even-numbered ones of said columns;

a left input to each of said adders in a column numbered 2N is provided with one of said dedicated connections to an output of a corresponding logic region located 0.5Q(2N) columns left of said column numbered 2N; and a right input to each of said adders in said column numbered 2N is provided with one of said dedicated connections to an output of a corresponding logic region located 0.5Q(2N) columns right of said column numbered 2N;

where Q(2N) is a largest integral power of 2 that evenly divides 2N.

18. A digital processing system comprising:

processing circuitry;

a memory coupled to said processing circuitry; and a programmable logic device as defined in claim 2 coupled to the processing circuitry and the memory.

19. A printed circuit board on which is mounted a programmable logic device as defined in claim 1.

20. The printed circuit board defined in claim 19 further comprising:

memory circuitry mounted on the printed circuit board and coupled to the programmable logic device.

21. The printed circuit board defined in claim 20 further comprising:

processing circuitry mounted on the printed circuit board and coupled to the memory circuitry.

22. A programmable logic region for use in a programmable logic device, said programmable logic region comprising a plurality of input terminals and at least one output terminal, and being programmable to selectively perform any of a plurality of logic functions on input signals applied to the input terminals to produce an output signal applied to the output terminal, said region further having:

additional logic dedicated to the performance of functions forming at least part of a multiplication operation; wherein:

said additional logic comprises a first logic unit for performing at least portions of both (i) two partial products of two multiplicands and (ii) summing said two partial products.

23. The programmable logic region of claim 22 wherein said first logic unit comprises a multiplexer having as inputs (a) at least one bit of one said two multiplicands and (b) at least one bit of the product of 2 and said one of said two multiplicands, and having as control signals at least one digit of another of said two multiplicands.

24. The programmable logic region of claim 23 wherein said multiplexer further has as an input (c) a sum of said input (a) and said input (b).

25. The programmable logic region of claim 24 wherein said sum of said input (a) and said input (b) is formed in said programmable logic region.

26. The programmable logic region of claim 24 wherein said multiplexer further has as an input (d) a single programmable bit.

27. The programmable logic region of claim 23 wherein said multiplexer has as control signals two said digits.

28. The programmable logic region of claim 22 wherein at least one input of said additional logic is programmably invertible for inversion of output of said additional logic.

29. The programmable logic region of claim 22 wherein:

said region has a plurality of inputs for applying said input signals on which said logic functions are performed and for applying signals common to a plurality of said regions; and when said additional logic is in use, input signals to said additional logic are applied to one or more of said plurality of inputs.

30. The programmable logic region of claim 29 wherein at least one of said input signals to said additional logic is applied to at least one of said inputs for applying signals common to a plurality of said regions.

31. The programmable logic region of claim 22 wherein said additional logic further comprises:

- a second said logic unit, said first logic unit performing said sum of partial products assuming a first value of a carry from another said region, and said second logic unit performing said sum of partial products assuming a second value of said carry;
- a carry input for said carry from said another said region; and
- a carry select unit for selecting said sum of partial products from one of said first and second logic units based on whether said carry has said first value or said second value.

32. The programmable logic region of claim 22 wherein said additional logic has a dedicated sum output separate from said output terminal.

33. The programmable logic region of claim 22 wherein:

said additional logic produces a carry value; and said region includes a dedicated carry input for receiving a carry value from additional logic of another said region and a dedicated carry output for sending a carry value to additional logic of another said region.

* * * * *